United States Patent
Chen et al.

(10) Patent No.: US 10,867,966 B2
(45) Date of Patent: Dec. 15, 2020

(54) PACKAGE STRUCTURE, PACKAGE-ON-PACKAGE STRUCTURE AND METHOD OF FABRICATING THE SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Sung-Feng Yeh, Taipei (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/398,138

(22) Filed: Apr. 29, 2019

(65) Prior Publication Data

US 2020/0343223 A1 Oct. 29, 2020

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/486* (2013.01); *H01L 21/4857* (2013.01); *H01L 21/6835* (2013.01); *H01L 23/3128* (2013.01); *H01L 23/49816* (2013.01); *H01L 23/5384* (2013.01); *H01L 23/5385* (2013.01); *H01L 23/5389* (2013.01); *H01L 24/08* (2013.01); *H01L 24/16* (2013.01); *H01L 24/17* (2013.01); *H01L 24/24* (2013.01); *H01L 24/32* (2013.01); *H01L 24/80* (2013.01); *H01L 24/95* (2013.01); *H01L 25/0652* (2013.01); *H01L 2221/68318* (2013.01); *H01L 2221/68327* (2013.01); *H01L 2221/68359* (2013.01);
(Continued)

(58) Field of Classification Search
None
See application file for complete search history.

(56) References Cited

U.S. PATENT DOCUMENTS 8,754,514 B2 * 6/2014 Yu .................. H01L 21/76805
257/686
8,895,440 B2 * 11/2014 Choi ................ H01L 23/49827
438/675

(Continued)

*Primary Examiner* — Evren Seven
(74) *Attorney, Agent, or Firm* — JCIPRNET

(57) ABSTRACT

A package structure includes a first semiconductor die, a second semiconductor die, an insulating encapsulant and a redistribution layer. The first semiconductor die has first conductive posts and a first protection layer laterally surrounding the first conductive posts. The second semiconductor die is embedded in the first protection layer and surrounded by the first conductive posts of the first semiconductor die, wherein the second semiconductor die includes second conductive posts. The insulating encapsulant is encapsulating the first semiconductor die and the second semiconductor die. The redistribution layer is disposed on the insulating encapsulant and connected with the first conductive posts and the second conductive posts, wherein the first semiconductor die is electrically connected with the second semiconductor die through the first conductive posts, the redistribution layer and the second conductive posts.

16 Claims, 23 Drawing Sheets

(51) Int. Cl.
  *H01L 23/538* (2006.01)
  *H01L 23/31* (2006.01)
  *H01L 21/48* (2006.01)
  *H01L 23/498* (2006.01)
  *H01L 21/683* (2006.01)

(52) U.S. Cl.
  CPC ........... *H01L 2224/08145* (2013.01); *H01L 2224/16235* (2013.01); *H01L 2224/1703* (2013.01); *H01L 2224/24137* (2013.01); *H01L 2224/24145* (2013.01); *H01L 2224/24153* (2013.01); *H01L 2224/24221* (2013.01); *H01L 2224/32145* (2013.01); *H01L 2224/80894* (2013.01)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,325,874 B2 * | 6/2019 | Pachamuthu | H01L 25/50 |
| 10,586,780 B2 * | 3/2020 | Pachamuthu | H01L 24/19 |
| 10,636,773 B2 * | 4/2020 | Kuo | H01L 21/6835 |
| 2008/0054457 A1 * | 3/2008 | Lin | H01L 21/563 257/737 |
| 2008/0122114 A1 * | 5/2008 | Lu | H01L 25/50 257/777 |
| 2011/0110065 A1 * | 5/2011 | Foster, Sr. | H01L 25/0657 361/803 |
| 2011/0241192 A1 * | 10/2011 | Ding | H01L 25/50 257/686 |
| 2012/0211892 A1 * | 8/2012 | Kim | H01L 24/20 257/774 |
| 2013/0026643 A1 * | 1/2013 | England | H01L 22/10 257/774 |
| 2014/0015131 A1 * | 1/2014 | Meyer | H01L 21/561 257/738 |
| 2016/0099213 A1 * | 4/2016 | Tae | H01L 24/82 257/777 |
| 2016/0276324 A1 * | 9/2016 | Lin | H01L 23/49827 |
| 2017/0250090 A1 * | 8/2017 | Yu | H01L 24/14 |
| 2018/0076179 A1 * | 3/2018 | Hsu | H01L 24/17 |

* cited by examiner

PACKAGE STRUCTURE, PACKAGE-ON-PACKAGE STRUCTURE AND METHOD OF FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
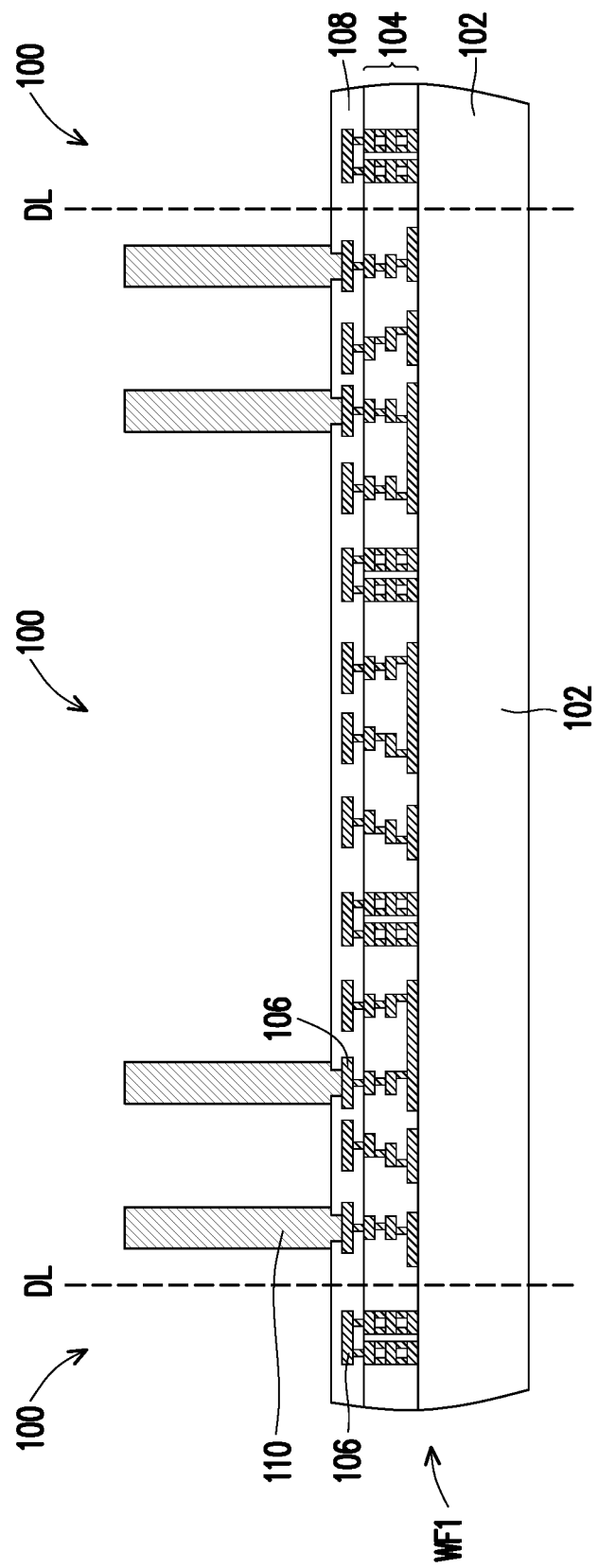
FIG. 1A to FIG. 1F are schematic sectional views of various stages in a method of fabricating a stacked die unit according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic sectional views of various stages in a method of fabricating a stacked die unit according to some exemplary embodiments of the present disclosure. Referring to FIG. 1A, a semiconductor wafer WF1 having a plurality of first semiconductor dies 100 is provided. As illustrated in FIG. 1A, each of the first semiconductor dies 100 includes a first semiconductor substrate 102, an interconnection layer 104, a plurality of first conductive pads 106, a first passivation layer 108, and a plurality of first conductive posts 110 (or through vias). In some embodiments, the first semiconductor substrate 102 may be a bulk silicon substrate or a silicon-on-insulator (SOI) substrate, and further includes active components (e.g., transistors or the like) and optionally passive components (e.g., resistors, capacitors, inductors or the like) formed therein. The interconnection layer 104 is disposed on the first semiconductor substrate 102 and may, for example, include a plurality of metallization layers and inter-dielectric layers stacked alternately. The first conductive pads 106 may be aluminum pads, copper pads or other suitable metal pads. The first conductive pads 106 are, for example, electrically connected to the interconnection layer 104. The first passivation layer 108 may be a silicon oxide layer, a silicon nitride layer, a silicon oxy-nitride layer or a dielectric layer formed of any suitable dielectric materials. The first passivation layer 108 covers the first conductive pads 106 and has a plurality of contact openings, wherein the first conductive pads 106 are partially exposed by the contact openings of the first passivation layer 108. In some embodiments, the first conductive posts 110 (through vias) are formed on the first conductive pads 106 by plating.

Figure 1B:
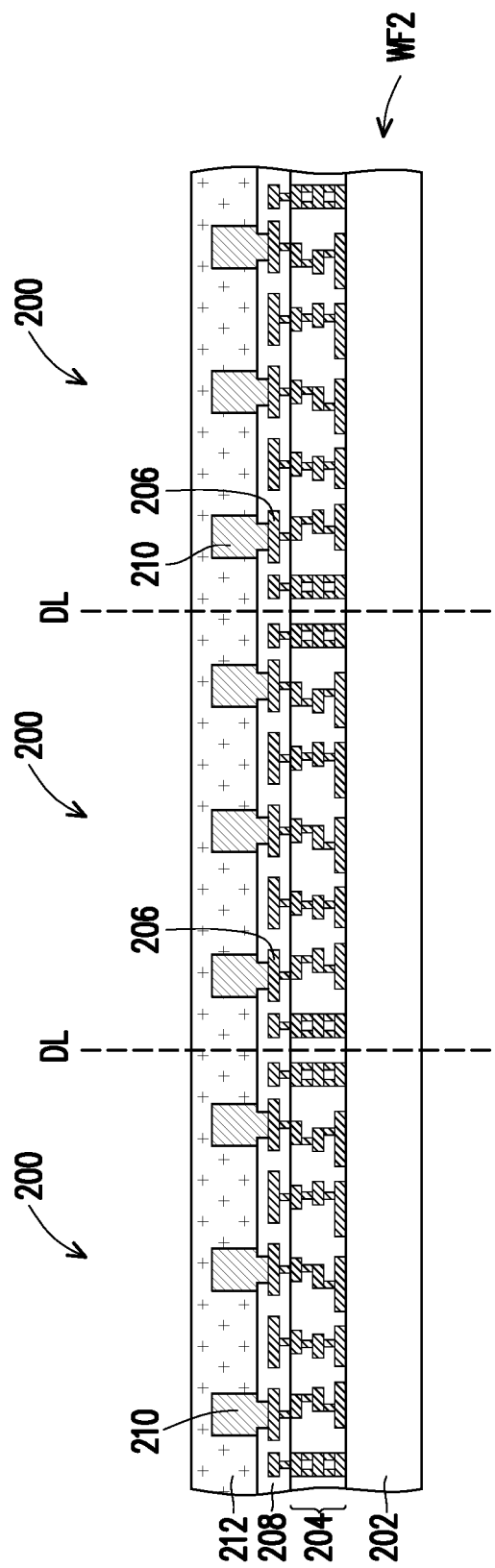

Referring to FIG. 1B, another semiconductor wafer WF2 having a plurality of second semiconductor dies 200 is provided. In the exemplary embodiment, each of the second semiconductor dies 200 includes a second semiconductor substrate 202, an interconnection layer 204, a plurality of second conductive pads 206, a second passivation layer 208, a plurality of second conductive posts 210 and a second protection layer 212. The dimensions or size of each of the second semiconductor dies 200 is smaller than the dimensions or size of each of the first semiconductor dies 100 illustrated in FIG. 1A.

In the exemplary embodiment, the second semiconductor substrate 202 may be a bulk silicon substrate or a silicon-on-insulator (SOI) substrate, and further includes active components (e.g., transistors or the like) and optionally passive components (e.g., resistors, capacitors, inductors or the like) formed therein. The interconnection layer 204 is disposed on the second semiconductor substrate 202 and may, for example, include a plurality of metallization layers and inter-dielectric layers stacked alternately. The second conductive pads 206 may be aluminum pads, copper pads or other suitable metal pads. The second conductive pads 206 are, for example, electrically connected to the interconnection layer 204. The second passivation layer 208 may be a silicon oxide layer, a silicon nitride layer, a silicon oxy-nitride layer or a dielectric layer formed of any suitable dielectric materials. The second passivation layer 208 covers the second conductive pads 206 and has a plurality of contact openings, wherein the second conductive pads 206 are partially exposed by the contact openings of the second passivation layer 208. In some embodiments, the second conductive posts 210 are formed on the second conductive pads 206 by plating. In some embodiments, the second protection layer 212 is formed on the second passivation layer 208, and covering the second conductive posts 210 so as to protect the second conductive posts 210. In certain embodiments, the semiconductor wafer WF2 may be diced along the dicing lines DL to separate the plurality of second semiconductor dies 200 from one another. Although the descriptions of the second semiconductor dies 200 is similar to the descriptions of the first semiconductor dies 100, it should be noted that the materials used therein may be the same or different based on design requirement.

Figure 1C:
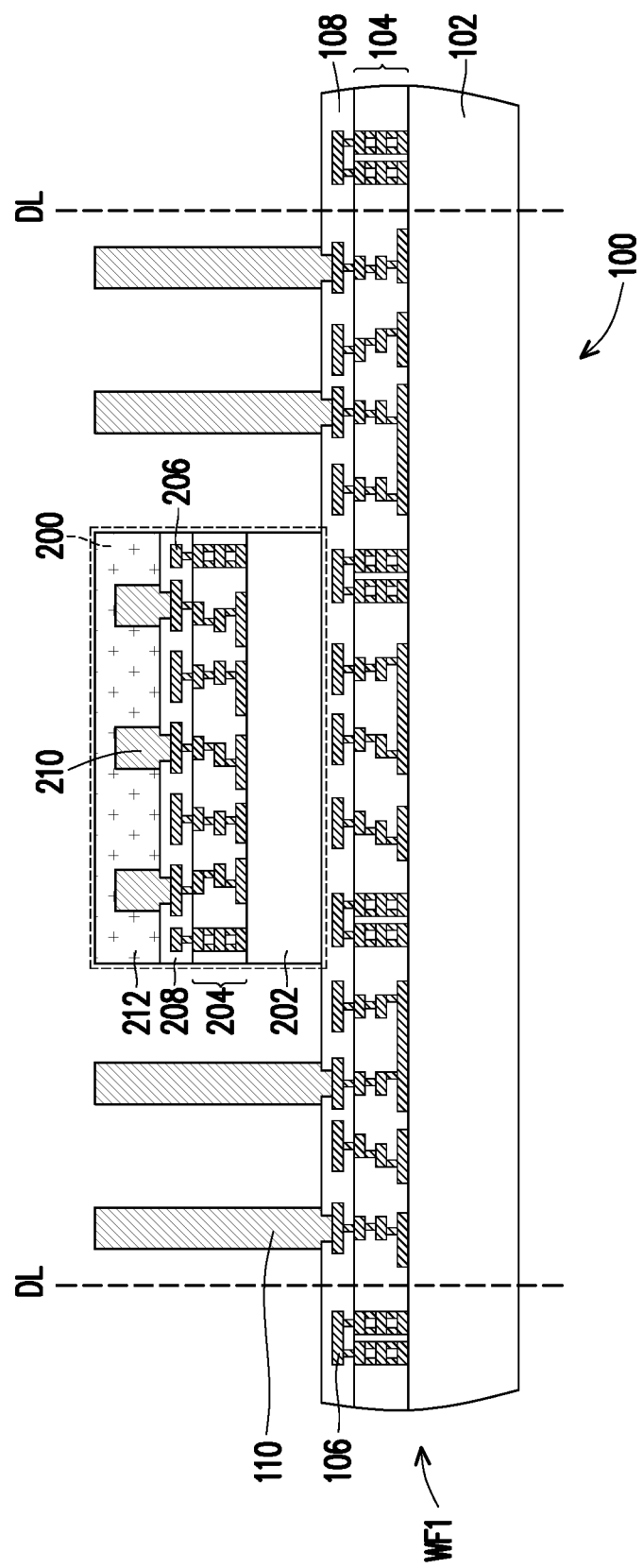

Referring to FIG. 1C, after separating the second semiconductor dies 200, at least one of the second semiconductor die 200 is stacked on the first semiconductor die 100. For example, a backside of the second semiconductor die 200 is fixed or bonded onto the first passivation layer 108 of each of the first semiconductor dies 100 in an area surrounded by the plurality of first conductive posts 110 (through vias). In the exemplary embodiment, the second semiconductor die 200 is fixed onto the first passivation layer 108 by fusion bonding. In some embodiments, fusion bonding is performed at a temperature range of 100° C. to 300° C. to generate chemical bonds for bonding the second semiconductor die 200 onto the first passivation layer 108 of each of the first semiconductor dies 100. In certain embodiments, the chemical bond is formed between the surfaces of the first passivation layer 108 and the second semiconductor substrate 202 (backside of the second semiconductor die 200). In some exemplary embodiments, the chemical bonds formed are covalent bonds. In some alternative embodiments, the second semiconductor die 200 is fixed or bonded onto the first passivation layer 108 of each of the first semiconductor dies 100 by a die attach film (not shown)

Figure 1D:
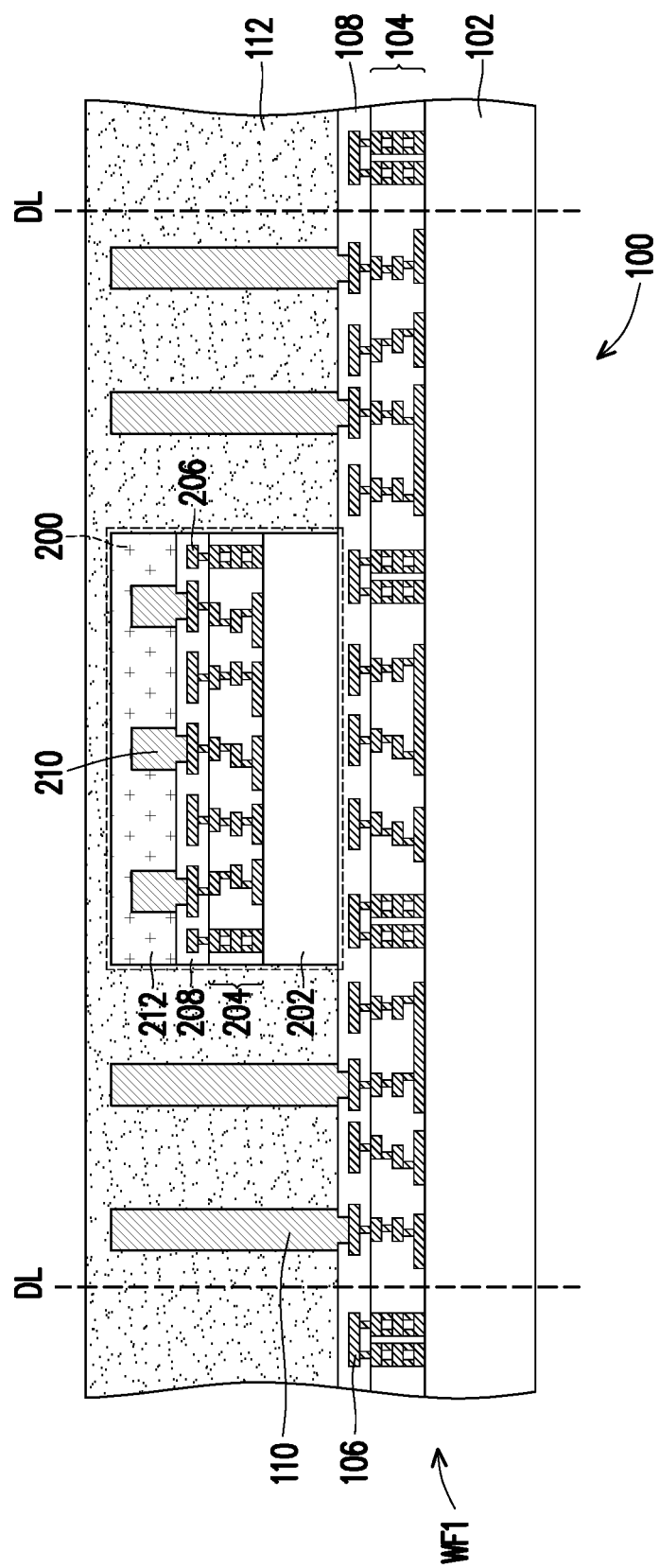

Referring to FIG. 1D, after bonding the second semiconductor die 200, a protective material 112 is formed over the surface of the first passivation layer 108 to cover the plurality of first conductive posts 110 (through vias) and the second semiconductor die 200. In some embodiments, the protective material 112 further covers the second protection layer 212 of the second semiconductor die 200. In certain embodiments, the protective material 112 fill into the gaps of adjacent first conductive posts 110, and fill up the gaps between the second semiconductor die 200 and the first conductive posts 110. In other words, the first conductive posts 110 and the second semiconductor die 200 are embedded and well protected by the protective material 112. In some embodiments, the protective material 112 includes polymers, dielectric materials, a molding compound, a resin material or the like. However, the disclosure is not limited thereto, and other suitable protective materials may be used. In one embodiment, the protective material 112 (used to form the first protective layer) is different from a material of the second protection layer 212. In another embodiment, the protective material 112 and the second protection layer 212 includes the same materials. The disclosure is not limited thereto.

Figure 1E:
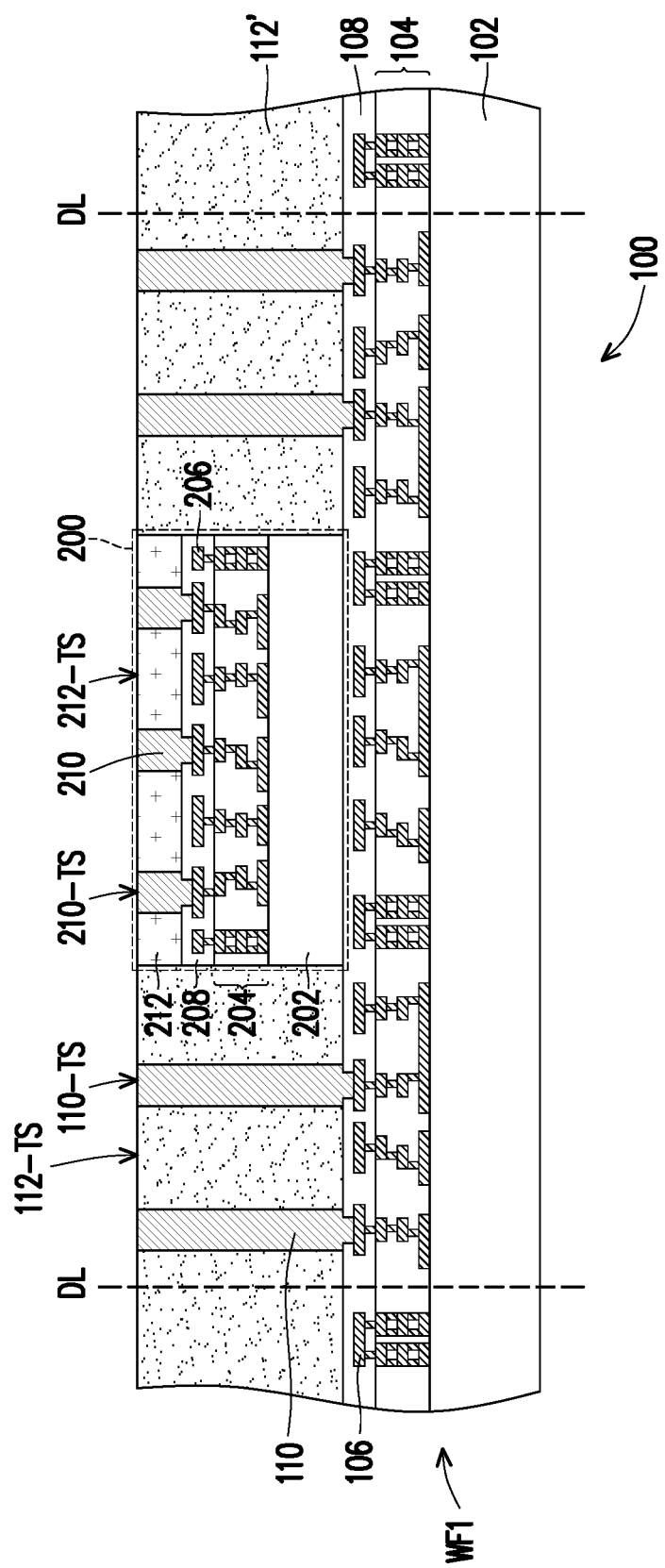

Referring to FIG. 1E, in a next step, the protective material 112 and the second protection layer 212 of the second semiconductor die 200 are ground or polished by a mechanical grinding process and/or a chemical mechanical polishing (CMP) process until the tops 110-TS of the first conductive posts 110 (through vias), and the tops 210-TS of the second conductive posts 210 are revealed. In some embodiments, the first conductive posts 110 (through vias) and the second conductive posts 210 are partially polished so that the tops 110-TS of the first conductive posts 110 (through vias), and the tops 210-TS of the second conductive posts 210 are levelled with a top surface 212-TS of the second protection layer 212. In some embodiments, the protective material 112 is polished to form the protection layer 112' (first protection layer). After the polishing process, a top surface 112-TS of the protection layer 112' is coplanar with the tops 110-TS of the first conductive posts 110 (through vias), the tops 210-TS of the second conductive posts 210 and the top surface 212-TS of the second protection layer 212. Furthermore, due to the formation of the protection layer 112' and the second protection layer 212 in different steps, it should be noted that an interface will exist in between the surfaces of the protection layer 112' and the second protection layer 212, regardless of whether the same or different materials are used or not.

Figure 1F:
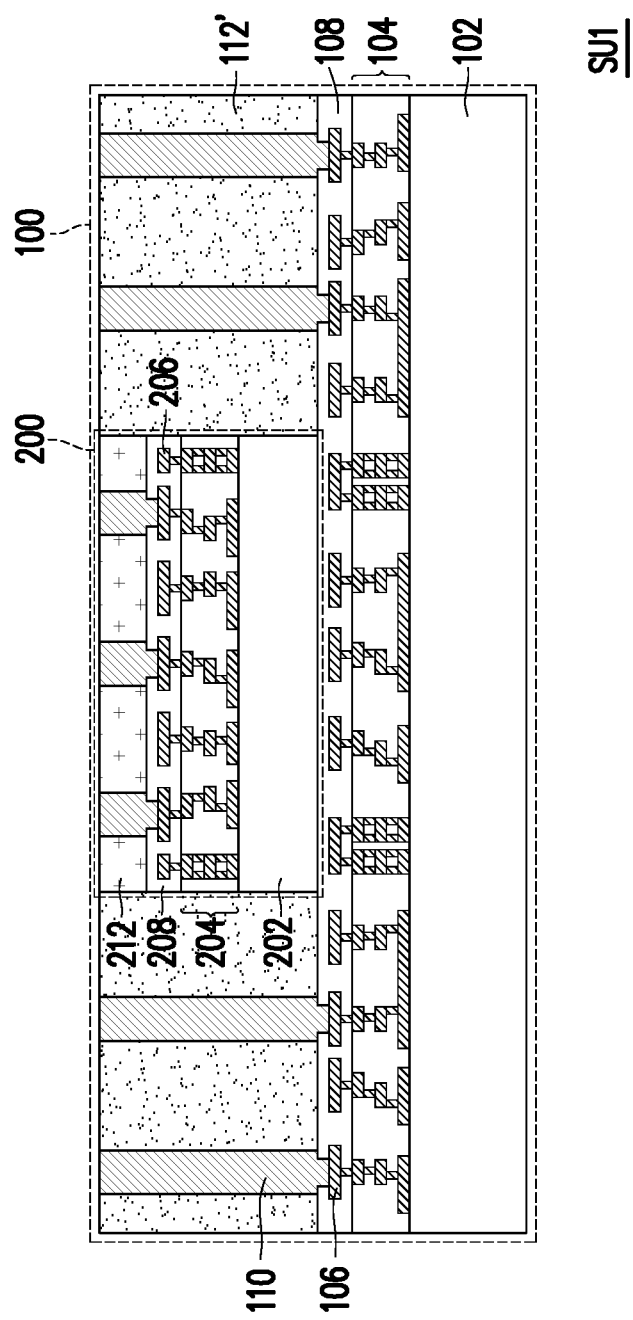

Referring to FIG. 1F, after the polishing process, the semiconductor wafer WF1 may be diced along the dicing lines DL (shown in FIG. 1E) to separate the plurality of first semiconductor dies 100 from one another to form a stacked die unit SU1. In the exemplary embodiment, the stacked die unit SU1 includes at least one second semiconductor die 200 stacked on the first semiconductor die 100. In certain embodiments, the second semiconductor die 200 is embedded within the protection layer 112' of the first semiconductor die 100 and laterally surrounded by the plurality of first conductive posts 110 (through vias). Although only one second semiconductor die 200 is shown to be stacked on the first semiconductor die 100, the disclosure is not limited thereto. In some other embodiments, the number of semiconductor dies stacked on the first semiconductor die 100 can be adjusted based on design requirement. Up to here, a stacked die unit SU1 according to some exemplary embodiments of the present disclosure is accomplished.

Figure 2A:
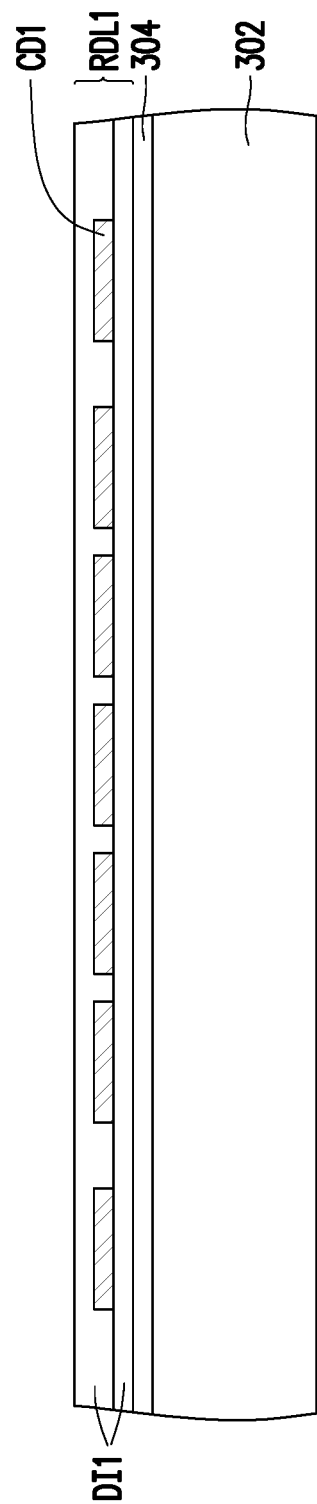
FIG. 2A to FIG. 2G are schematic sectional views of various stages in a method of fabricating a package structure according to some exemplary embodiments of the present disclosure.

FIG. 2A to FIG. 2G are schematic sectional views of various stages in a method of fabricating a package structure according to some exemplary embodiments of the present disclosure. Referring to FIG. 2A, a carrier 302 is provided. In some embodiments, the carrier 302 may be a glass carrier or any suitable carrier for carrying a semiconductor wafer or a reconstituted wafer for the manufacturing method of the package structure. In some embodiments, the carrier 302 is coated with a debond layer 304. The material of the debond layer 304 may be any material suitable for bonding and de-bonding the carrier 302 from the above layer(s) or any wafer(s) disposed thereon.

In some embodiments, the debond layer 304 may include a dielectric material layer made of a dielectric material including any suitable polymer-based dielectric material (such as benzocyclobutene ("BCB"), polybenzoxazole ("PBO")). In an alternative embodiment, the debond layer 304 may include a dielectric material layer made of an epoxy-based thermal-release material, which loses its adhesive property when heated, such as a light-to-heat-conversion (LTHC) release coating film. In a further alternative embodiment, the debond layer 304 may include a dielectric material layer made of an ultra-violet (UV) glue, which loses its adhesive property when exposed to UV lights. In certain embodiments, the debond layer 304 may be dispensed as a liquid and cured, or may be a laminate film laminated onto the carrier 302, or may be the like. The top surface of the debond layer 304, which is opposite to a bottom surface contacting the carrier 302, may be levelled and may have a high degree of coplanarity. In certain embodiments, the debond layer 304 is, for example, a LTHC layer with good chemical resistance, and such layer enables room temperature de-bonding from the carrier 302 by applying laser irradiation, however the disclosure is not limited thereto.

In an alternative embodiment, a buffer layer (not shown) may be coated on the debond layer 304, where the debond layer 304 is sandwiched between the buffer layer and the carrier 302, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

As further illustrated in FIG. 2A, a redistribution layer RDL1 is formed over the carrier 302. For example, the redistribution layer RDL1 is formed on the debond layer 304, and the formation of the redistribution layer RDL1 includes sequentially forming one or more dielectric layers DI1 and one or more conductive layers CD1 in alternation. In some embodiments, the redistribution layer RDL1 includes two dielectric layers DI1 and one conductive layer CD1 as shown in FIG. 2A, where the conductive layer CD1 is sandwiched between the dielectric layers DI1. However, the disclosure is not limited thereto. The numbers of the dielectric layers DI1 and the conductive layer CD1 included in the redistribution layer RDL1 is not limited thereto, and may be designated and selected based on the demand. For example, the numbers of the dielectric layers DI1 and the conductive layers CD1 may be one or more than one.

In certain embodiments, the material of the dielectric layers DI1 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DI1 may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer CD1 may be made of conductive materials formed by electroplating or deposition, such as aluminum, titanium, copper, nickel, tungsten, and/or alloys thereof, which may be patterned using a photolithography and etching process. In some embodiments, the conductive layer CD1 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2B:
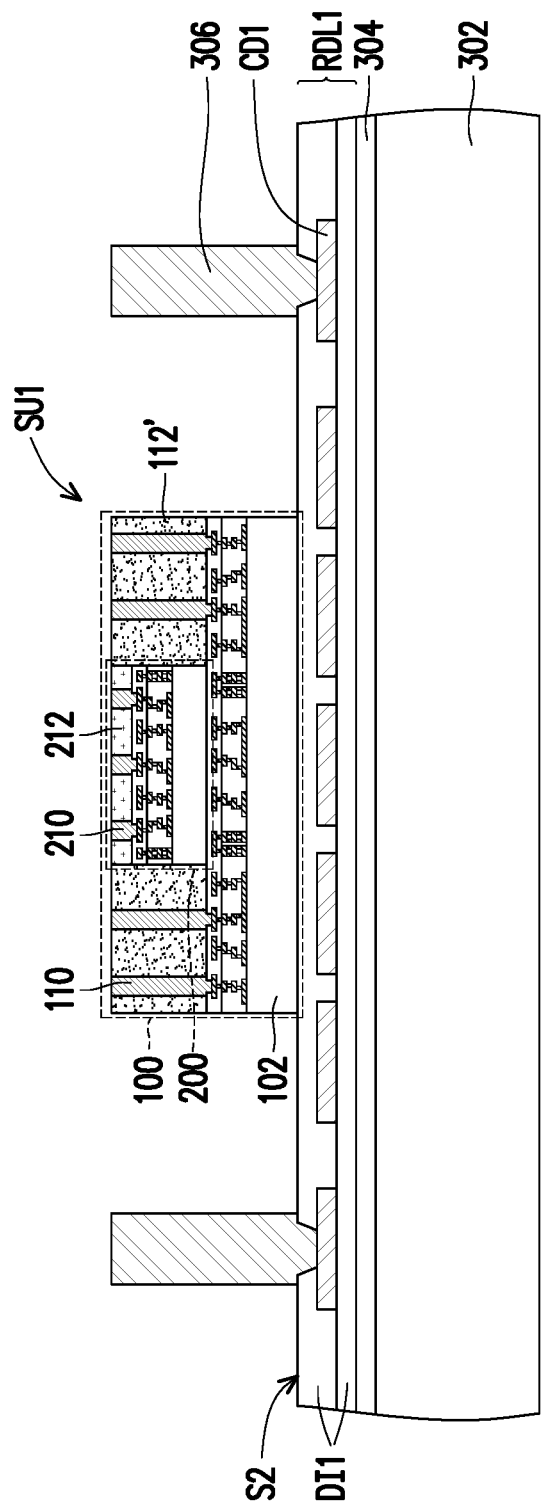

Referring to FIG. 2B, after forming the redistribution layer RDL1, at least one stacked die unit SU1 obtained in FIG. 1F, and a plurality of through insulator vias 306 are provided on the redistribution layer RDL1 and over the carrier 302. In some embodiments, the through insulator vias 306 are through integrated fan-out ("InFO") vias. In one embodiment, the formation of the through insulator vias 306 includes forming a mask pattern (not shown) with openings, then forming a metallic material (not shown) filling up the openings by electroplating or deposition, and removing the mask pattern to form the through insulator vias 306 on the redistribution layer RDL1. In certain embodiments, the through insulator vias 306 fills into a via opening that reveals the conductive layer CD1 of the redistribution layer RDL1, so that the through insulator vias 306 may be electrically connected to the redistribution layer RDL1. In some embodiments, the material of the mask pattern may include a positive photo-resist or a negative photo-resist. In one embodiment, the material of the through insulator vias 306 may include a metal material such as copper or copper alloys, or the like. However, the disclosure is not limited thereto.

In an alternative embodiment, the through insulator vias 306 may be formed by forming a seed layer (not shown) on the redistribution layer RDL1; forming the mask pattern with openings exposing portions of the seed layer; forming the metallic material on the exposed portions of the seed layer to form the through insulator vias 306 by plating; removing the mask pattern; and then removing portions of the seed layer exposed by the through insulator vias 306. For example, the seed layer may be a titanium/copper composited layer. For simplification, only two through insulator vias 306 are illustrated in FIG. 2B. However, it should be noted that the number of through insulator vias 306 is not limited thereto, and can be selected based on requirement.

Furthermore, in some embodiments, at least one stacked die unit SU1 is picked and placed on the redistribution layer RDL1. In certain embodiments, the stacked die unit SU1 is placed on the redistribution layer RDL1 in a way that the first semiconductor substrate 102 of the first semiconductor die 100 is attached to the dielectric layer DI1 of the redistribution layer RDL1. For example, the first semiconductor substrate 102 is attached to the redistribution layer RDL1 through a die attach film (not shown). By using the die attach film, a better adhesion between the stacked die unit SU1 and the redistribution layer RDL1 is ensured. In the exemplary embodiment, only one stacked die unit SU1 is illustrated. However, it should be noted that the number of stacked die unit SU1 placed on the redistribution layer RDL1 is not limited thereto, and this can be adjusted based on design requirement.

In some embodiments, when more than one stacked die units SU1 are placed on the redistribution layer RDL1, the stacked die units SU1 may be arranged in an array, and when the stacked die units SU1 are arranged in an array, the through insulator vias 306 may be classified into groups. The number of the stacked die units SU1 may correspond to the number of groups of the through insulator vias 306. In the exemplary embodiment, the stacked die unit SU1 may be picked and placed on the redistribution layer RDL1 after the formation of the through insulator vias 306. However, the disclosure is not limited thereto. In some alternative embodiments, the stacked die unit SU1 may be picked and placed on the redistribution layer RDL1 before the formation of the through insulator vias 306.

Furthermore, in the exemplary embodiment, the stacked die unit SU1 at least includes a second semiconductor die 200 stacked on a first semiconductor die 100. For example, the first semiconductor die 100 and the second semiconductor die 200 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 2C:
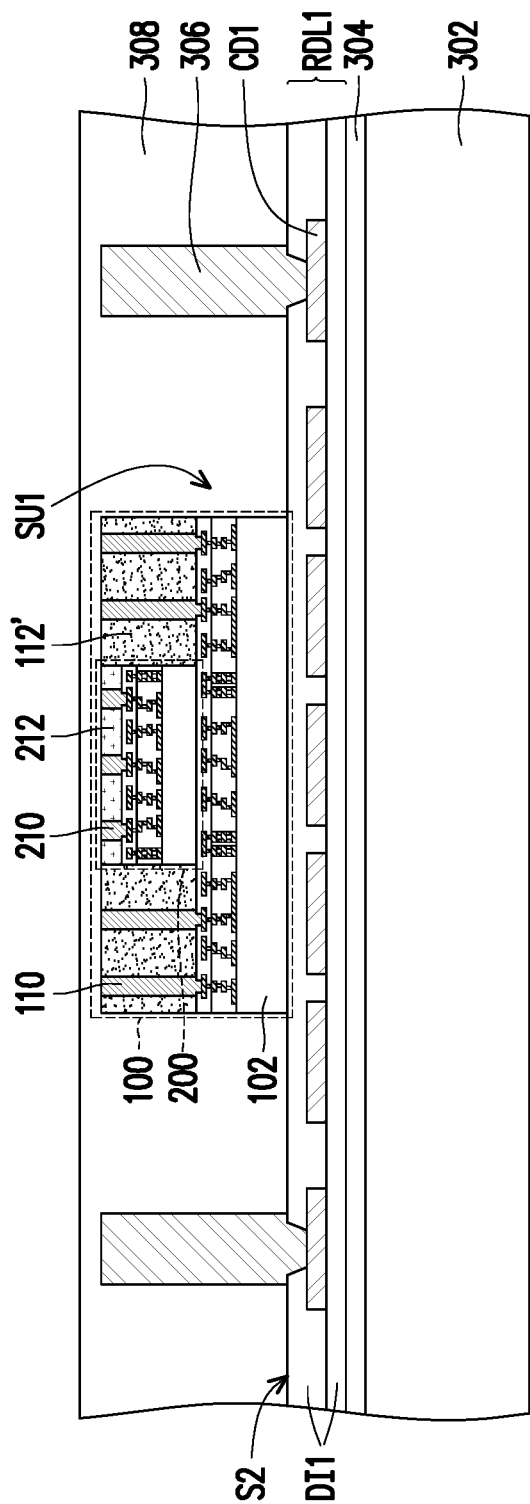

Referring to FIG. 2C, in a next step, an insulating material 308 is formed on the redistribution layer RDL1 and over the stacked die unit SU1. In some embodiments, the insulating material 308 is formed through, for example, a compression molding process, filling up the gaps between the stacked die unit SU1 and the through insulating vias 306 to encapsulate the stacked die unit SU1. The insulating material 308 also fills up the gaps between adjacent through insulator vias 306 to encapsulate the through insulator vias 306. At this stage, the first conductive posts 110 (through vias), the protection layer 112', the second conductive posts 210 and the second protection layer 212 are encapsulated by and well protected by the insulating material 308. In other words, the first conductive posts 110 (through vias), the protection layer 112' of the first semiconductor die 100, and the second conductive posts 210, the second protection layer 212 of the second semiconductor die 200 are not revealed and are well protected by the insulating material 308.

In some embodiments, the insulating material 308 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 308 may include an acceptable insulating encapsulation material. In some embodiments, the insulating material 308 may further include inorganic filler or inorganic compound (e.g. silica, clay, and so on) which can be added therein to optimize coefficient of thermal expansion (CTE) of the insulating material 308. The disclosure is not limited thereto.

Figure 2D:
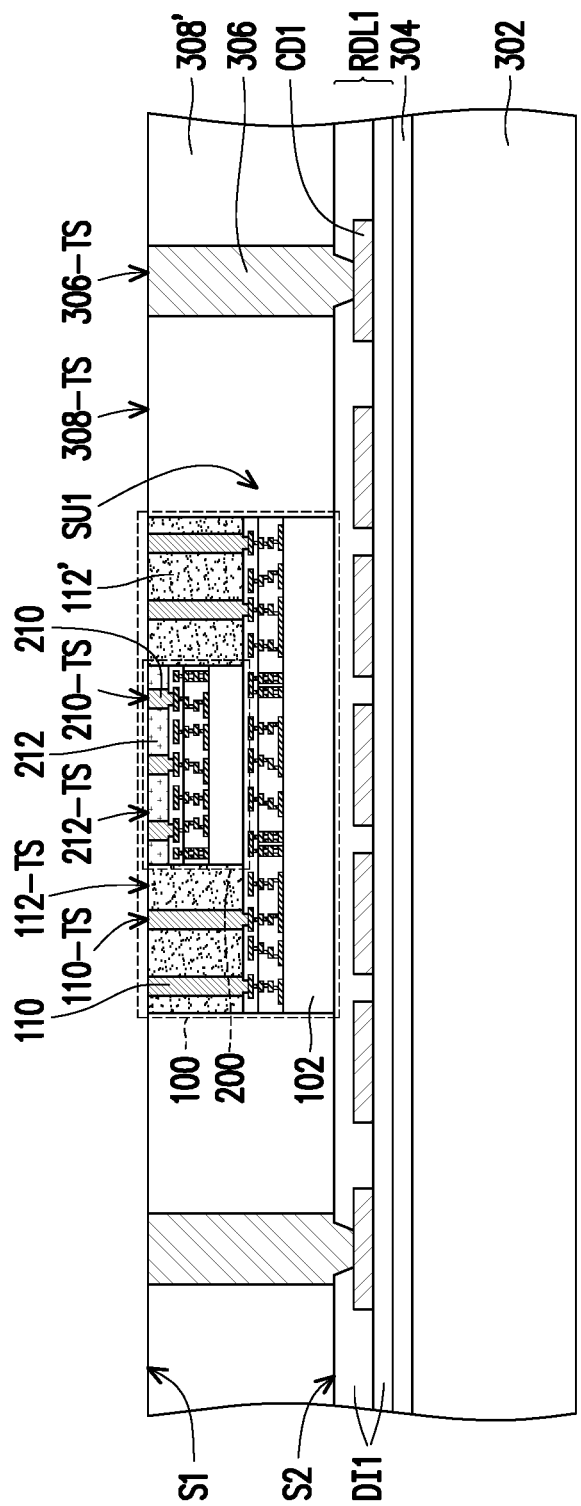

Referring to FIG. 2D, in some embodiments, the insulating material 308 is partially removed to expose the through insulator vias 306, the first conductive posts 110 (through vias) and the second conductive posts 210. In some embodiments, the insulating material 308 are ground or polished by a planarization step. For example, the planarization step is performed through a mechanical grinding process and/or a chemical mechanical polishing (CMP) process until the tops 110-TS of the first conductive posts 110 (through vias), and the tops 210-TS of the second conductive posts 210 are revealed. In some embodiments, the through insulator vias 306 may be partially polished so that the top surfaces 306-TS of the through insulator vias 306 are levelled with the tops 110-TS of the first conductive posts 110 (through vias), and the tops 210-TS of the second conductive posts 210. In other words, the through insulator vias 306, the first conductive posts 110 (through vias) and the second conductive posts 210 may also be slightly grinded/polished.

In the illustrated embodiment, the insulating material 308 is polished to form an insulating encapsulant 308'. In some embodiments, the top surface 308-TS of the insulating encapsulant 308', the top surface 306-TS of the through insulator vias 306, the tops 110-TS of the first conductive posts 110 (through vias), the top surface 112-TS of the protection layer 112', the tops 210-TS of the second conductive posts 210, the top surface 212-TS of the second protection layer 212 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 2E:
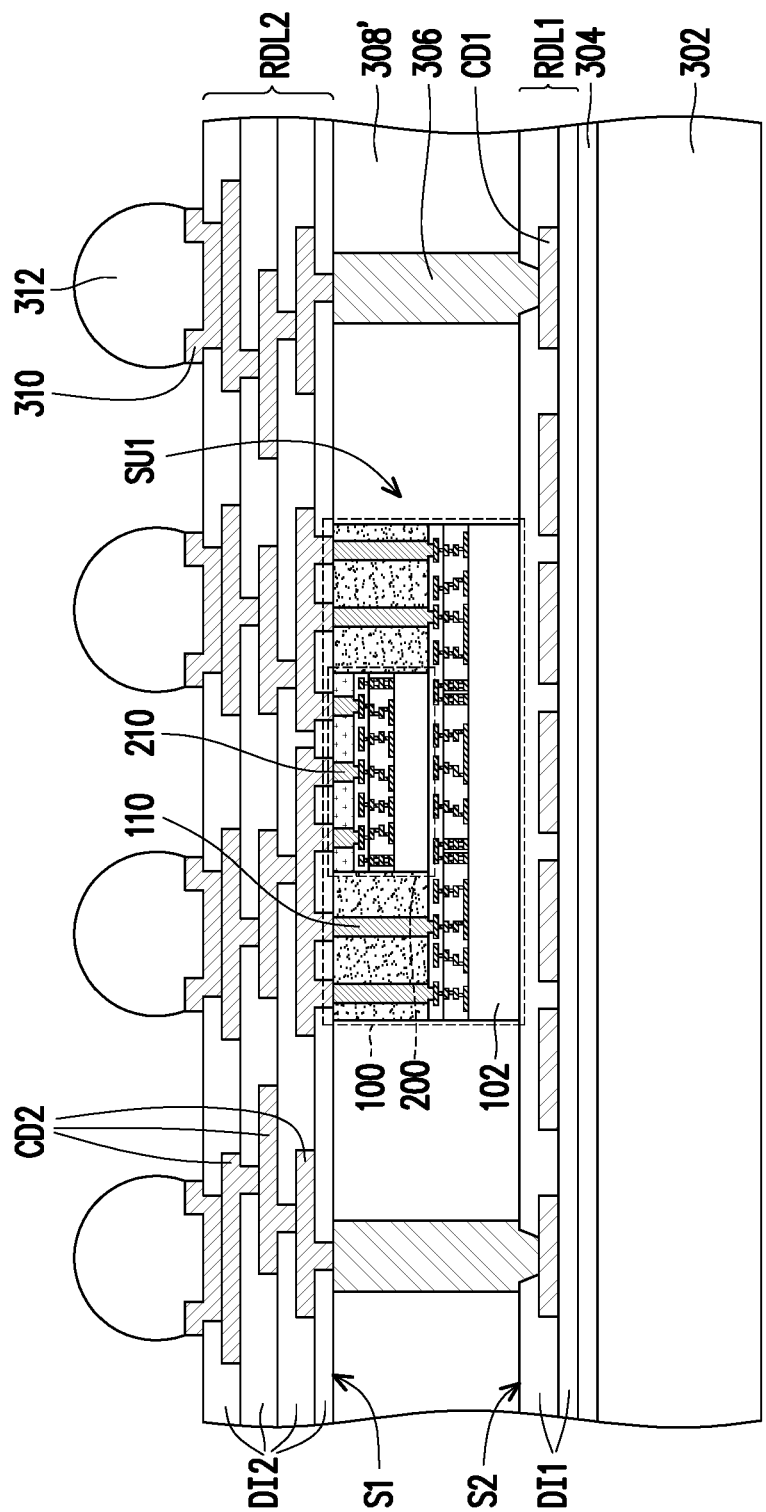

Referring to FIG. 2E, after the grinding/polishing step, a redistribution layer RDL2 is formed on the insulating encapsulant 308', the through insulator vias 306 and on the stacked die unit SU1. For example, the insulating encapsulant 308' has a first surface S1 and a second surface S2 opposite to the first surface S1, wherein the redistribution layer RDL2 is formed on the first surface S1, and the redistribution layer RDL1 is formed on the second surface S2 of the insulating encapsulant 308'. In some embodiments, the redistribution layer RDL2 is electrically to the through insulator vias 306, and is electrically connected to the first semiconductor die 100 and the second semiconductor die 200 through the first conductive posts 110 and the second conductive posts 210 respectively. In certain embodiments, the redistribution layer RDL2 electrically connects the first conductive posts 110 of the first semiconductor die 100 to the second conductive posts 210 of the second semiconductor die 200. In other words, the first semiconductor die 100 is electrically connected with the second semiconductor die 200 through the first conductive posts 110, the redistribution layer RDL2 and the second conductive posts 210. In some embodiments, the stacked die unit SU1 is electrically connected to the through insulator vias 306 through the redistribution layer RDL2.

Furthermore, in some embodiments, the formation of the redistribution layer RDL2 includes sequentially forming one or more dielectric layers DI2, and one or more conductive layers CD2 in alternation. In certain embodiments, the conductive layers CD2 are sandwiched between the dielectric layers DI2. Although only three layers of the conductive layers CD2 and four layers of dielectric layers DI2 are illustrated herein, however, the scope of the disclose is not limited by the embodiments of the disclosure. In other embodiments, the number of conductive layers CD2 and the dielectric layers DI2 may be adjusted based on product requirement. In some embodiments, the conductive layers CD2 are electrically connected to the first conductive posts 110 (through vias) of the first semiconductor die 100, and electrically connected to the second conductive posts 210 of the second semiconductor die 200. Furthermore, the conductive layers CD2 are electrically connected to the through insulator vias 306. In some embodiments, the materials of the dielectric layer DI2 and the conductive layer CD2 of the redistribution layer RDL2 is similar to a material of the dielectric layer DI1 and the conductive layer CD1 mentioned for the redistribution layer RDL1. Therefore, the detailed description of the dielectric layer DI2 and the conductive layer CD2 will be omitted herein.

After forming the redistribution layer RDL2, a plurality of conductive pads 310 may be disposed on an exposed top surface of the topmost layer of the conductive layers CD2 for electrically connecting with conductive balls. In certain embodiments, the conductive pads 310 are for example, under-ball metallurgy (UBM) patterns used for ball mount. As shown in FIG. 2E, the conductive pads 310 are formed on and electrically connected to the redistribution layer RDL2. In some embodiments, the materials of the conductive pads 310 may include copper, nickel, titanium, tungsten, or alloys thereof or the like, and may be formed by an electroplating process, for example. The number of conductive pads 310 are not limited in this disclosure, and may be selected based on the design layout. In some alternative embodiments, the conductive pads 310 may be omitted. In other words, conductive balls 312 formed in subsequent steps may be directly disposed on the redistribution layer RDL2.

After forming the conductive pads 310, a plurality of conductive balls 312 is disposed on the conductive pads 310 and over the redistribution layer RDL2. In some embodiments, the conductive balls 312 may be disposed on the conductive pads 310 by a ball placement process or reflow process. In some embodiments, the conductive balls 312 are, for example, solder balls or ball grid array (BGA) balls. In some embodiments, the conductive balls 312 are connected to the redistribution layer RDL2 through the conductive pads 310. In certain embodiments, some of the conductive balls 312 may be electrically connected to the stacked die unit SU1 through the redistribution layer RDL2. Furthermore, some of the conductive balls 312 may be electrically connected to the through insulator vias 306 through the redistribution layer RDL2. The number of the conductive balls 312 is not limited to the disclosure, and may be designated and selected based on the number of the conductive pads 310.

Figure 2F:
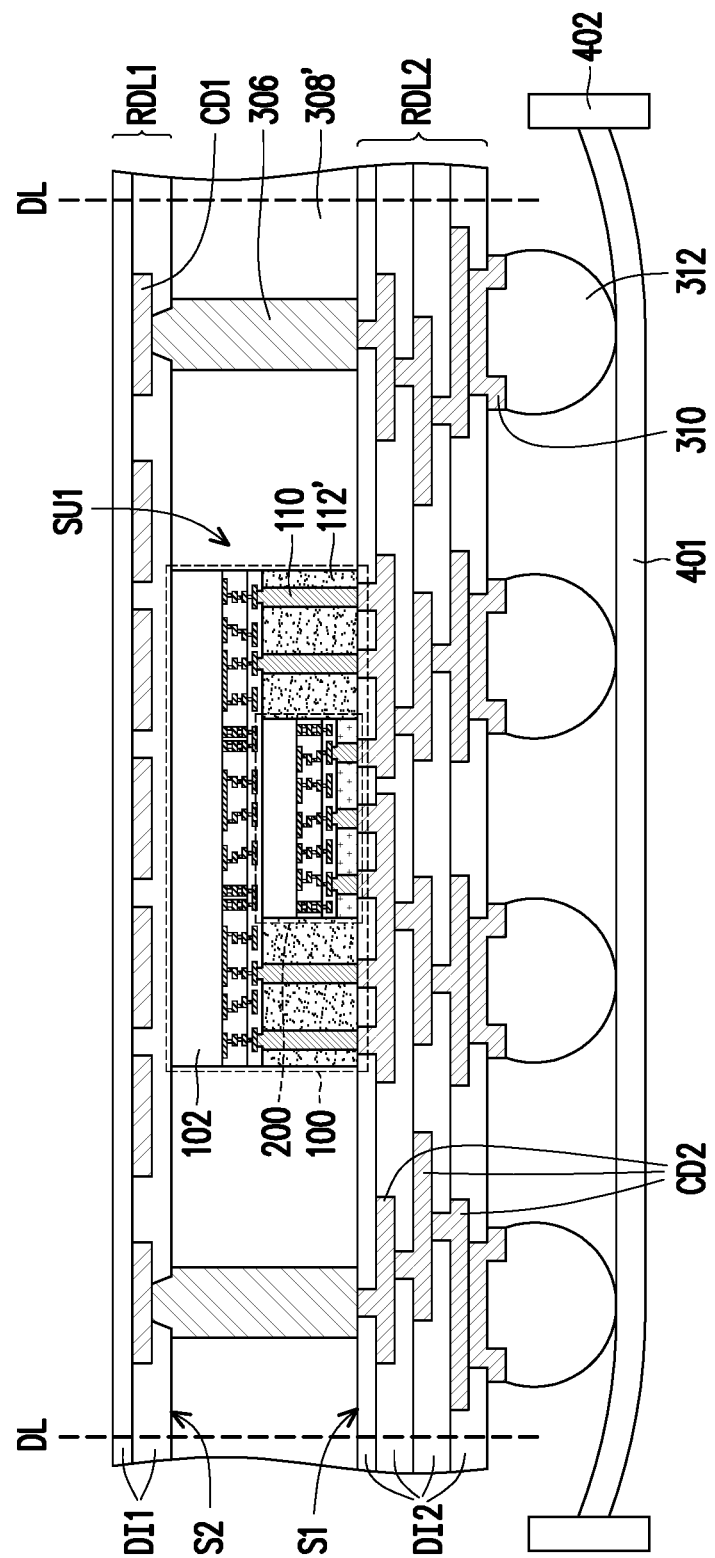

Referring to FIG. 2F, after forming the redistribution layer RDL2 and placing the conductive balls 312, the structure shown in FIG. 2E may be turned upside down and attached to a tape 401 (e.g., a dicing tape) supported by a frame 402. As illustrated in FIG. 2F, the carrier 302 is debonded and is separated from the redistribution layer RDL1. In some embodiments, the de-bonding process includes projecting a light such as a laser light or an UV light on the debond layer 304 (e.g., the LTHC release layer) so that the carrier 302 can be easily removed along with the debond layer 304. During the de-bonding step, the tape 401 is used to secure the package structure before de-bonding the carrier 302 and the debond layer 304. After the de-bonding process, a backside surface of the redistribution layer RDL1 is revealed or exposed. In certain embodiments, a dielectric layer DI1 of the redistribution layer RDL1 is revealed or exposed.

Figure 2G:
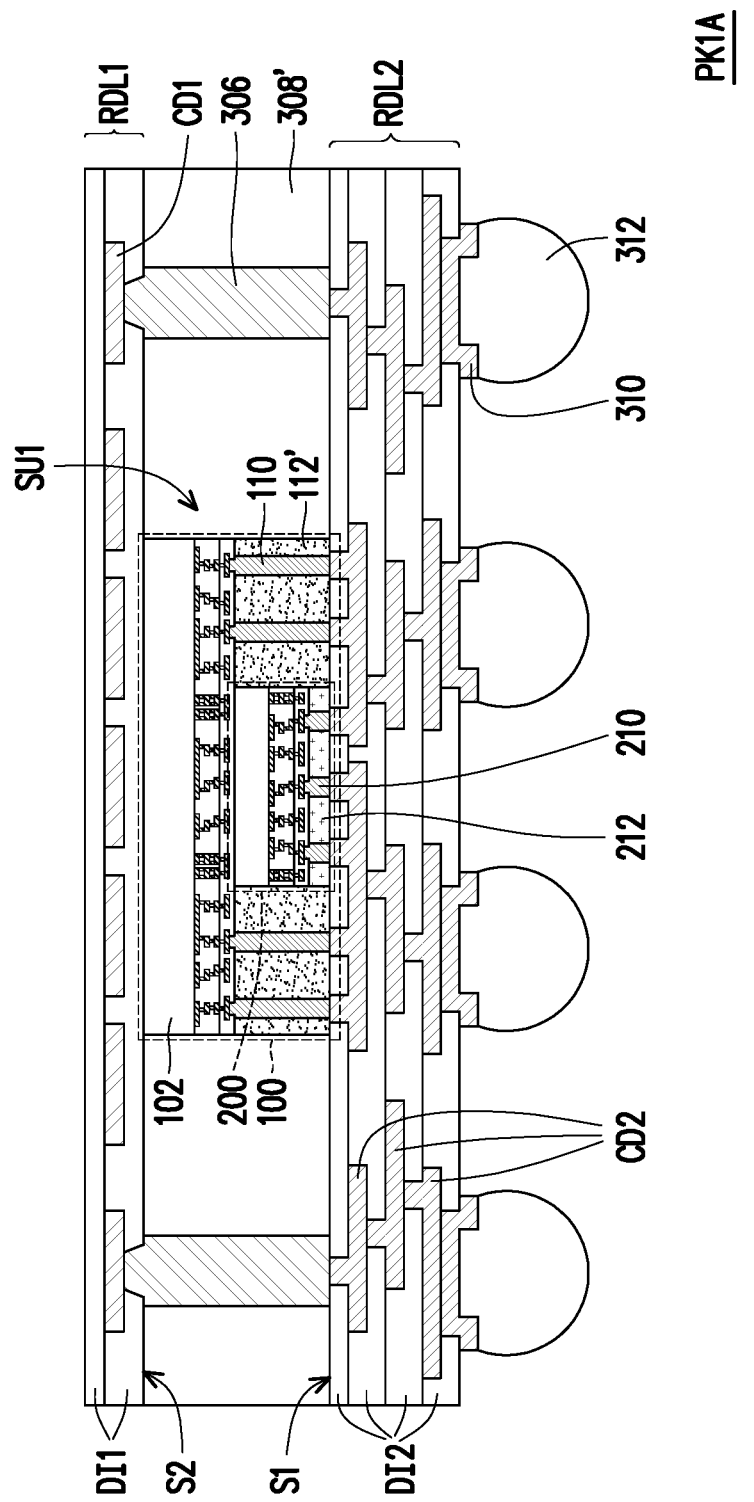

Referring to FIG. 2G, after the de-bonding process, a dicing process is performed along the dicing lines DL (shown in FIG. 2F) to cut the whole wafer structure (cutting through the insulating encapsulant 308', and the redistribution layers RDL1 and RDL2) into a plurality of package structures PK1A. In the exemplary embodiment, the dicing process is a wafer dicing process including mechanical blade sawing or laser cutting. In a subsequent process, the separated package structures PK1A may for example, be disposed onto a circuit substrate or onto other components based on requirements.

Figure 3:
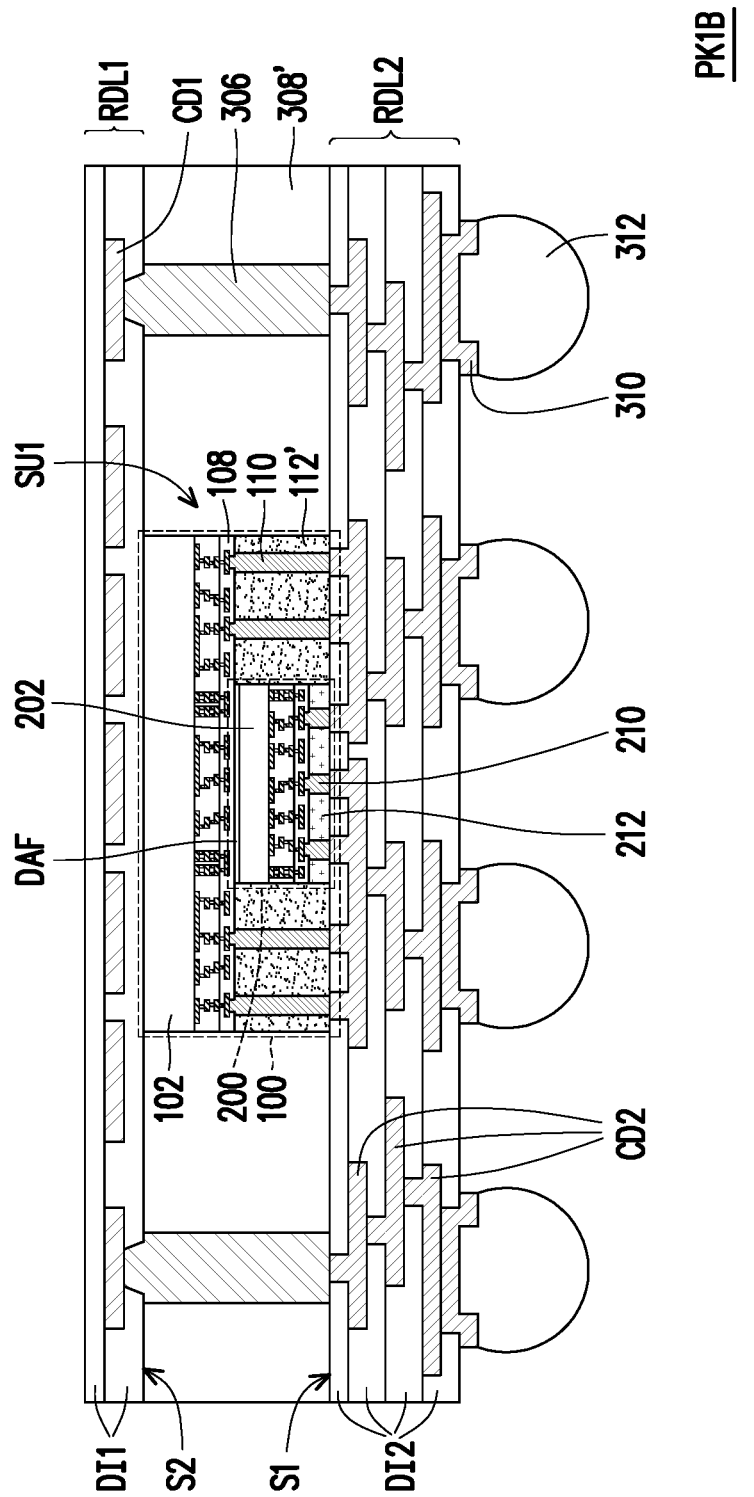
FIG. 3 is a schematic sectional view of a package structure according to some other exemplary embodiments of the present disclosure.

FIG. 3 is a schematic sectional view of a package structure according to some other exemplary embodiments of the present disclosure. The package structure PK1B illustrated in FIG. 3 is similar to the package structure PK1A illustrated in FIG. 2G, hence the same reference numerals are used to refer to the same or liked parts, and its detailed description will be omitted herein. The difference between the embodiments is in the way of fixing the second semiconductor die 200 to the first semiconductor die 100 in the stacked die unit SU1. In the previous embodiment, the second semiconductor die 200 is fixed onto the first passivation layer 108 by fusion bonding. However, the disclosure is not limited thereto. Referring to FIG. 3, in some embodiments, the second semiconductor die 200 may be fixed onto the first passivation layer 108 of the first semiconductor die 100 by using a die attach film DAF. In other words, the die attach film DAF is located in between the second semiconductor substrate 202 of the second semiconductor die 200 and the first passivation layer 108 of the first semiconductor die 100.

Figure 4:
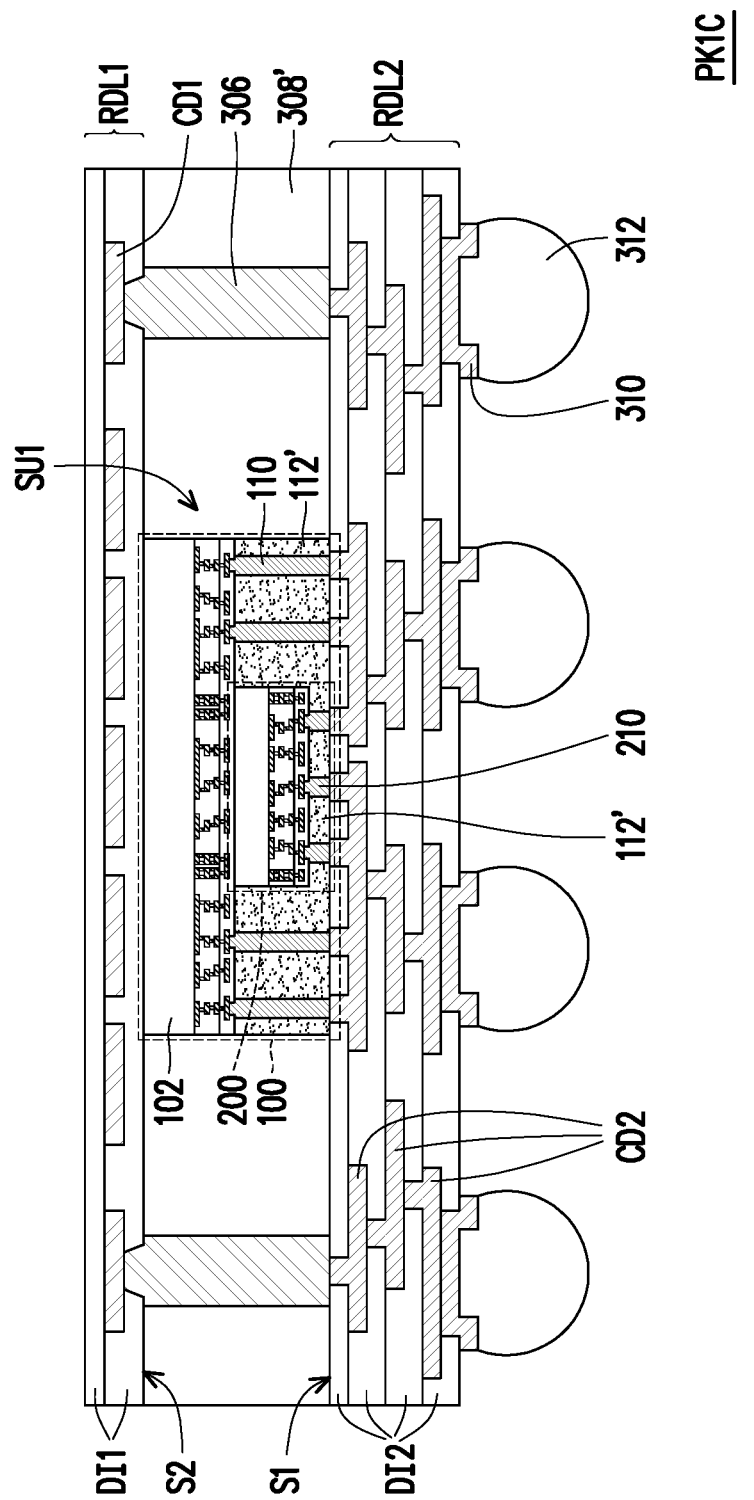
FIG. 4 is a schematic sectional view of a package structure according to some other exemplary embodiments of the present disclosure.

FIG. 4 is a schematic sectional view of a package structure according to some other exemplary embodiments of the present disclosure. The package structure PK1C illustrated in FIG. 4 is similar to the package structure PK1A illustrated in FIG. 2G, hence the same reference numerals are used to refer to the same or liked parts, and its detailed description will be omitted herein. The difference between the embodiments is that the second protection layer 212 is omitted from the second semiconductor die 200 of the package structure PK1C. Referring to FIG. 4, the second semiconductor die 200 has second conductive posts 210 that are exposed or revealed. Therefore, after fixing the second semiconductor die 200 onto the first semiconductor die 100 and forming the protection layer 112', the protection layer 112' will cover and come in physical contact with the second conductive posts 210 of the second semiconductor die 200. In other words, the protection layer 112' is sufficient to protect both of the first conductive posts 110 (through vias) and the second conductive posts 210. Furthermore, since the second protection layer 212 is omitted, the interface between the surfaces of the protection layer 112' and the second protection layer 212 will also be absent from the package structure PK1C.

Figure 5:
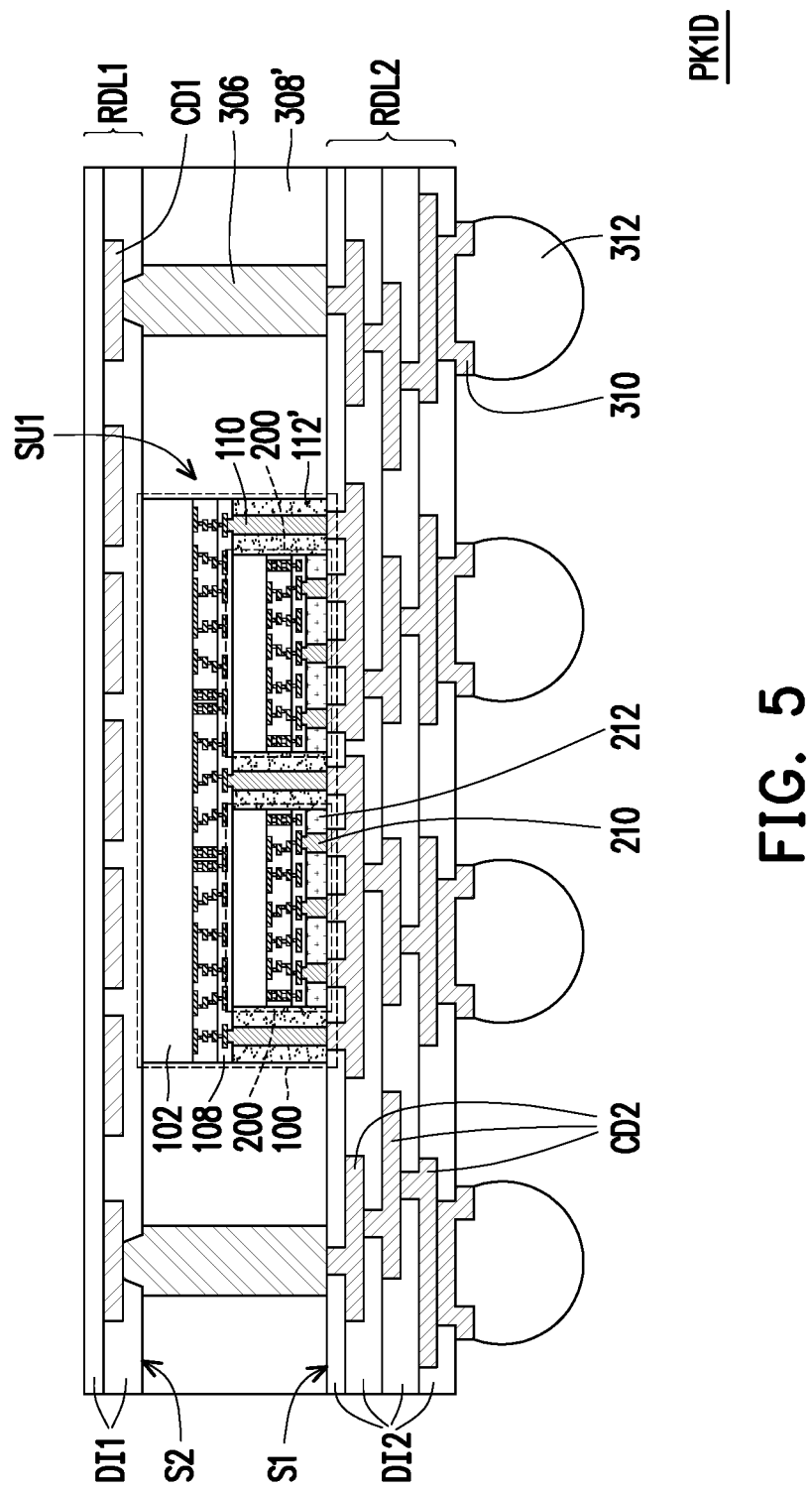
FIG. 5 is a schematic sectional view of a package structure according to some other exemplary embodiments of the present disclosure.

FIG. 5 is a schematic sectional view of a package structure according to some other exemplary embodiments of the present disclosure. The package structure PK1D illustrated in FIG. 5 is similar to the package structure PK1A illustrated in FIG. 2G, hence the same reference numerals are used to refer to the same or liked parts, and its detailed description will be omitted herein. The difference between the embodiments is in the number of second semiconductor dies 200 fixed onto the first semiconductor die 100. Referring to FIG. 5, two of the second semiconductor dies 200 are fixed on the first passivation layer 108 of the first semiconductor die 100. In some embodiments, the two second semiconductor dies 200 are embedded in the protection layer 112' of the first semiconductor die 100. Furthermore, each of the second semiconductor dies 200 are surrounded by the plurality of first conductive posts 110 (through vias). In certain embodiments, one of the second semiconductor die 200 is separated from another one of the second semiconductor die 200 by having the first conductive posts 110 located therebetween. Moreover, the two second semiconductor dies 200 are located on the same plane and same surface on the first semiconductor die 100, and are substantially coplanar with each other.

Figure 6:
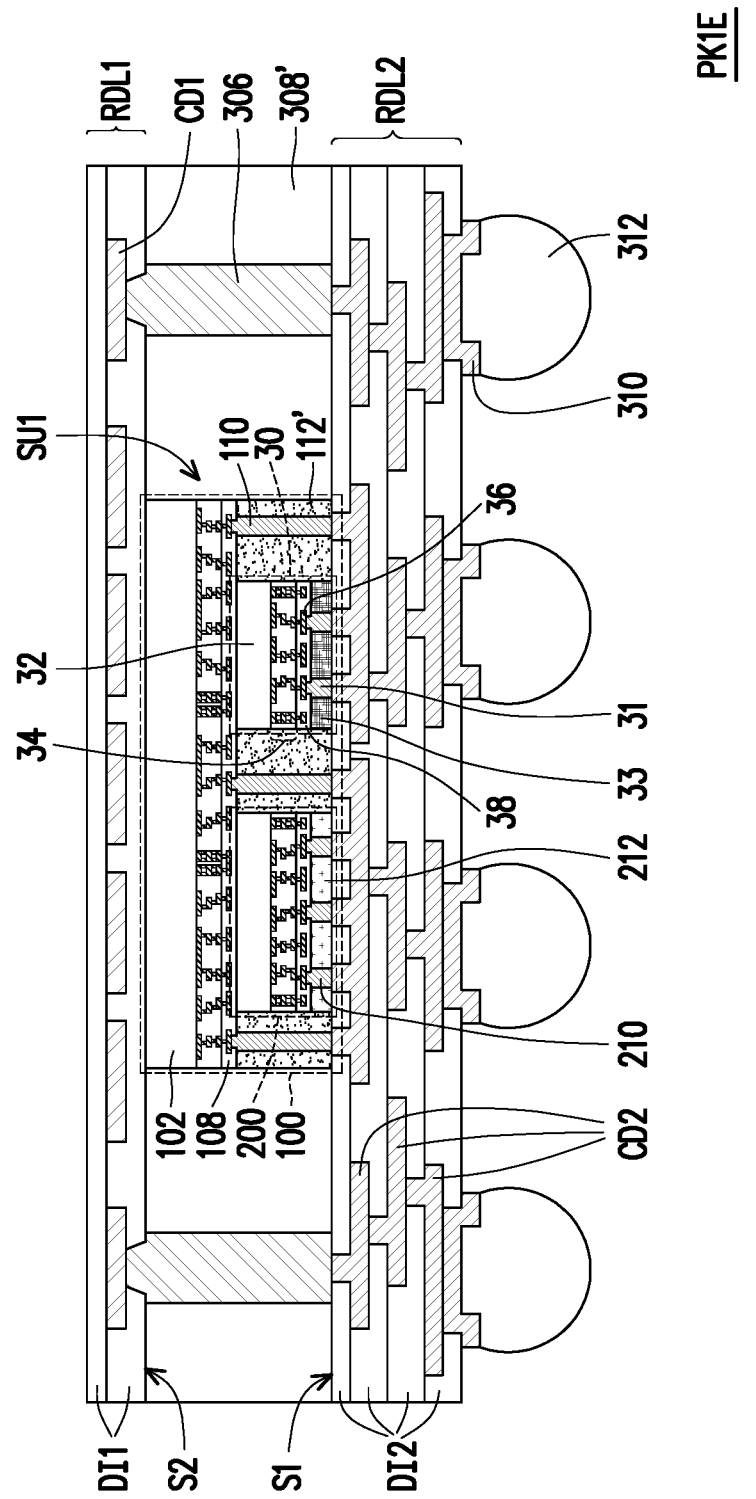
FIG. 6 is a schematic sectional view of a package structure according to some other exemplary embodiments of the present disclosure.

FIG. 6 is a schematic sectional view of a package structure according to some other exemplary embodiments of the present disclosure. The package structure PK1E illustrated in FIG. 6 is similar to the package structure PK1A illustrated in FIG. 2G, hence the same reference numerals are used to refer to the same or liked parts, and its detailed description will be omitted herein. The difference between the embodiments is that a third semiconductor die 30 is further included. Referring to FIG. 6, in some embodiments, the third semiconductor die 30 is disposed on the first passivation layer 108 of the first semiconductor die 100 adjacent to the second semiconductor die 200. In some embodiments, the dimensions of the third semiconductor die 30 is smaller than dimensions of the second semiconductor die 200 and the first semiconductor die 100. However, the disclosure is not limited thereto, and the dimensions of the third semiconductor die 30 may be selected based on requirement. In certain embodiments, the third semiconductor die 30, the second semiconductor die 200 and the first semiconductor die 100 are different types of semiconductor dies. However, the disclosure is not limited thereto. In alternative embodiments, the third semiconductor die 30 may be the same type of semiconductor die as with any one of the first semiconductor die 100 or the second semiconductor die 200, just with different dimensions or sizes.

In the exemplary embodiment, the third semiconductor dies 30 includes a third semiconductor substrate 32, an interconnection layer 34, a plurality of third conductive pads 36, a third passivation layer 38, a plurality of third conductive posts 31 and a third protection layer 33. The third semiconductor substrate 32 may be a bulk silicon substrate or a silicon-on-insulator (SOI) substrate, and further includes active components (e.g., transistors or the like) and optionally passive components (e.g., resistors, capacitors, inductors or the like) formed therein. The interconnection layer 34 is disposed on the third semiconductor substrate 32 and may, for example, include a plurality of metallization layers and inter-dielectric layers stacked alternately. The third conductive pads 36 may be aluminum pads, copper pads or other suitable metal pads. The third conductive pads 36 are, for example, electrically connected to the interconnection layer 34. The third passivation layer 38 may be a silicon oxide layer, a silicon nitride layer, a silicon oxynitride layer or a dielectric layer formed of any suitable dielectric materials. The third passivation layer 38 covers the third conductive pads 36 and has a plurality of contact openings, wherein the third conductive pads 36 are partially exposed by the contact openings of the third passivation layer 38. In some embodiments, the third conductive posts 31 are formed on the third conductive pads 36 by plating. In some embodiments, the third protection layer 33 is formed on the third passivation layer 38, and covering the third conductive posts 31 so as to protect the third conductive posts 31. Furthermore, as illustrated in FIG. 6, the third semiconductor die 30 is embedded in the protection layer 112' of the first semiconductor die 100, and being surrounded by the plurality of first conductive posts 110 (through vias). In addition, the redistribution layer RDL2 is electrically connected to the third conductive posts 31 of the third semiconductor die 30. In certain embodiments, the third semiconductor die 30 is electrically connected to the first semiconductor die 100 and/or the second semiconductor die through the redistribution layer RDL2.

Figure 7:
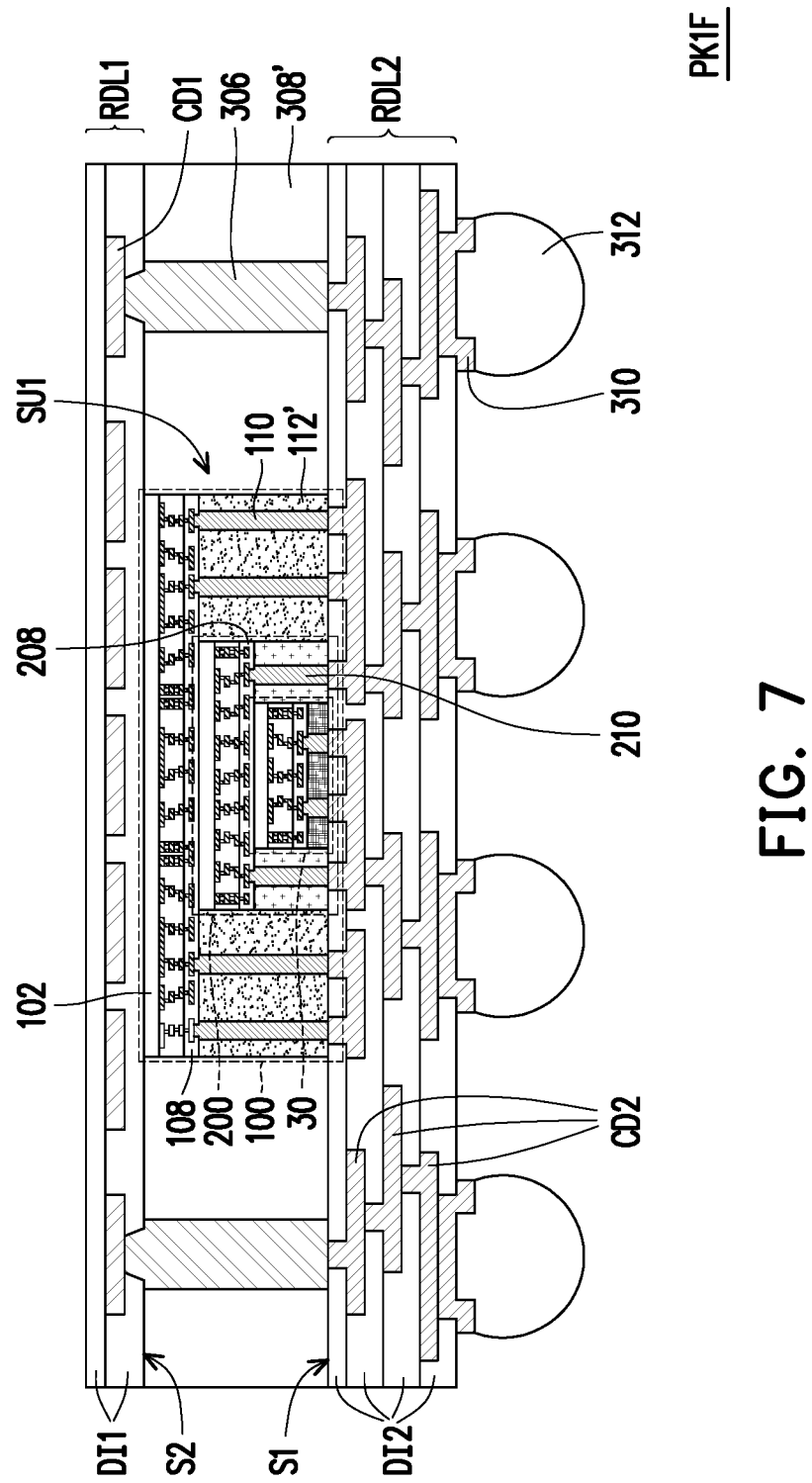
FIG. 7 is a schematic sectional view of a package structure according to some other exemplary embodiments of the present disclosure.

FIG. 7 is a schematic sectional view of a package structure according to some other exemplary embodiments of the present disclosure. The package structure PK1F illustrated in FIG. 7 is similar to the package structure PK1E illustrated in FIG. 6, hence the same reference numerals are used to refer to the same or liked parts, and its detailed description will be omitted herein. The difference between the embodiments is in the position of the third semiconductor die 30. Referring to FIG. 7, in the stacked die unit SUE the third semiconductor die 30 is disposed on the second semiconductor die 200. The dimensions of the third semiconductor die 30 is smaller than dimensions of the second semiconductor die 200 and the first semiconductor die 100. Furthermore, in certain embodiments, the third semiconductor die 30 is disposed on the second passivation layer 208 of the second semiconductor die 200, and being surrounded by the second conductive posts 210. On the other hand, the second semiconductor die 200 is further disposed on the first passivation layer 108 of the first semiconductor die 100, and being surrounded by the first conductive posts 110 (through vias).

Figure 8:
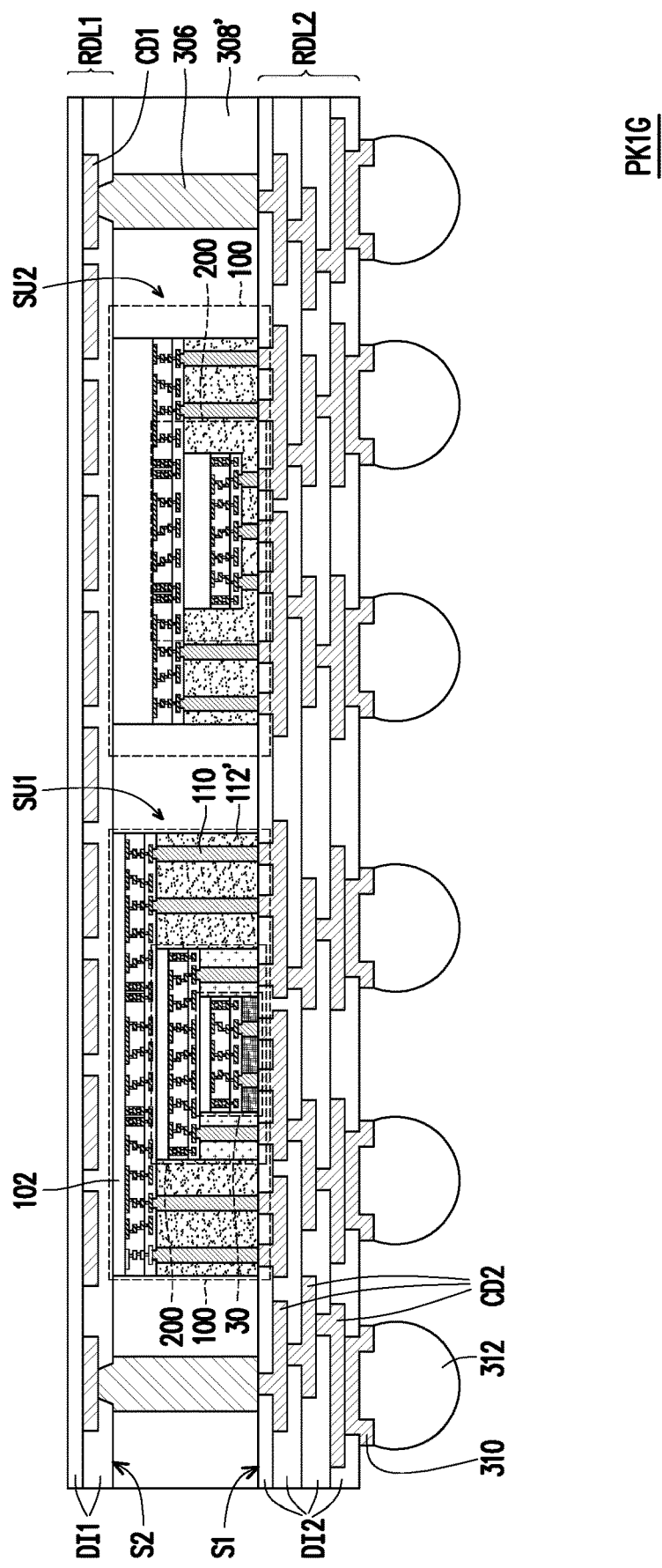
FIG. 8 is a schematic sectional view of a package structure according to some other exemplary embodiments of the present disclosure.

FIG. 8 is a schematic sectional view of a package structure according to some other exemplary embodiments of the present disclosure. The package structure PK1G illustrated in FIG. 8 is similar to the package structure PK1F illustrated in FIG. 7, hence the same reference numerals are used to refer to the same or liked parts, and its detailed description will be omitted herein. The difference between the embodiments is that two stacked die units (SU1/SU2) are included in the package structure PK1G. Referring to FIG. 8, in the exemplary embodiment, a stacked die unit SU1 and a stacked die unit SU2 is included. The number of stacked semiconductor dies in the stacked die unit SU1 is different than the number of stacked semiconductor dies in the stacked die unit SU2. For example, the stacked die unit SU1 includes a first semiconductor die 100, a second semiconductor die 200 and a third semiconductor die 30 stacked together, whereas the stacked die unit SU2 includes a first semiconductor die 100 and a second semiconductor die 200. Although only two stacked die units (SU1/SU2) are illustrated herein, however, it should be noted that the number of stacked dies units in each of the package structure is not limited thereto. For example, in alternative embodiments, the package structure may include two or more stacked die units. Furthermore, the number and arrangements of the semiconductor dies in each of the stacked die unit may be the same or different based on design requirement.

Figure 9:
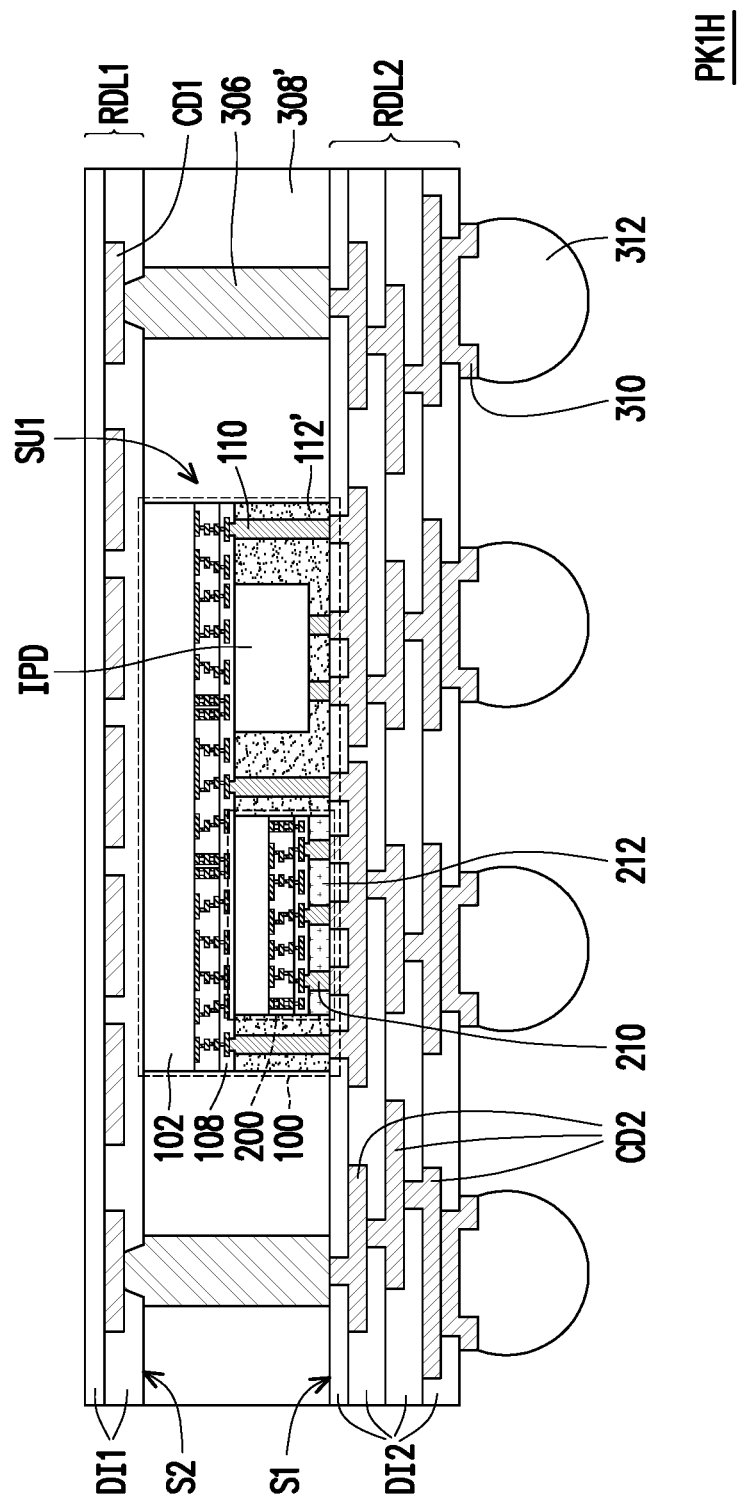
FIG. 9 is a schematic sectional view of a package structure according to some other exemplary embodiments of the present disclosure.

FIG. 9 is a schematic sectional view of a package structure according to some other exemplary embodiments of the present disclosure. The package structure PK1H illustrated in FIG. 9 is similar to the package structure PK1A illustrated in FIG. 2G, hence the same reference numerals are used to refer to the same or liked parts, and its detailed description will be omitted herein. The difference between the embodiments is that an integrated passive device IPD is further included in the package structure PK1H. Referring to FIG. 9, in some embodiments, an integrated passive device IPD may be disposed on the first passivation layer 108 of the first semiconductor die 100 and embedded within the protection layer 112'. The integrated passive device IPD may be disposed on the same surface and located on the same plane of the first semiconductor die 100 as with the second semiconductor die 200, and be electrically connected to the redistribution layer RDL2. Furthermore, the first conductive posts 110 surrounds both the second semiconductor die 200 and the integrated passive device IPD.

Figure 10:
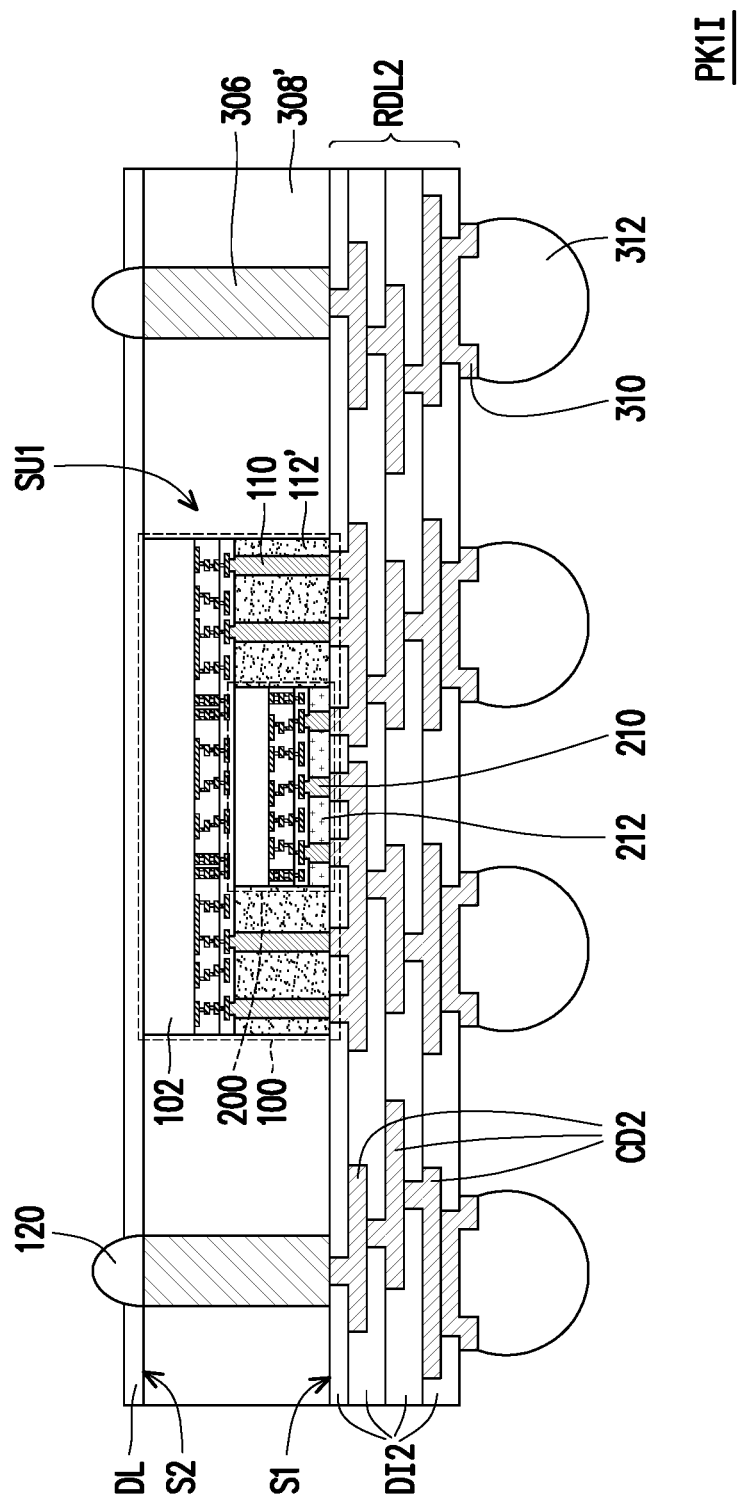
FIG. 10 is a schematic sectional view of a package structure according to some other exemplary embodiments of the present disclosure.

FIG. 10 is a schematic sectional view of a package structure according to some other exemplary embodiments of the present disclosure. The package structure PK1I illustrated in FIG. 10 is similar to the package structure PK1A illustrated in FIG. 2G, hence the same reference numerals are used to refer to the same or liked parts, and its detailed description will be omitted herein. The difference between the embodiments is that the redistribution layer RDL1 is omitted from the package structure PK1I. Referring to FIG. 10, in some embodiments, a dielectric layer DL is disposed on the second surface S2 of the insulating encapsulant 308' in replacement of the redistribution layer RDL1. In certain embodiments, the dielectric layer DL has openings that reveal the through insulator vias 306, whereas conductive terminals 120 are further disposed in the openings of the dielectric layer DL and connected to the through insulator vias 306. In other words, a package structure PK1I with dual side terminals is accomplished without the redistribution layer RDL1. In alternative embodiments, the conductive terminals 120 may be omitted, and the dielectric layer DL may cover up the backside (second surface S2) of the insulating encapsulant 308' and the backside of the stacked die unit SU1.

Figure 11:
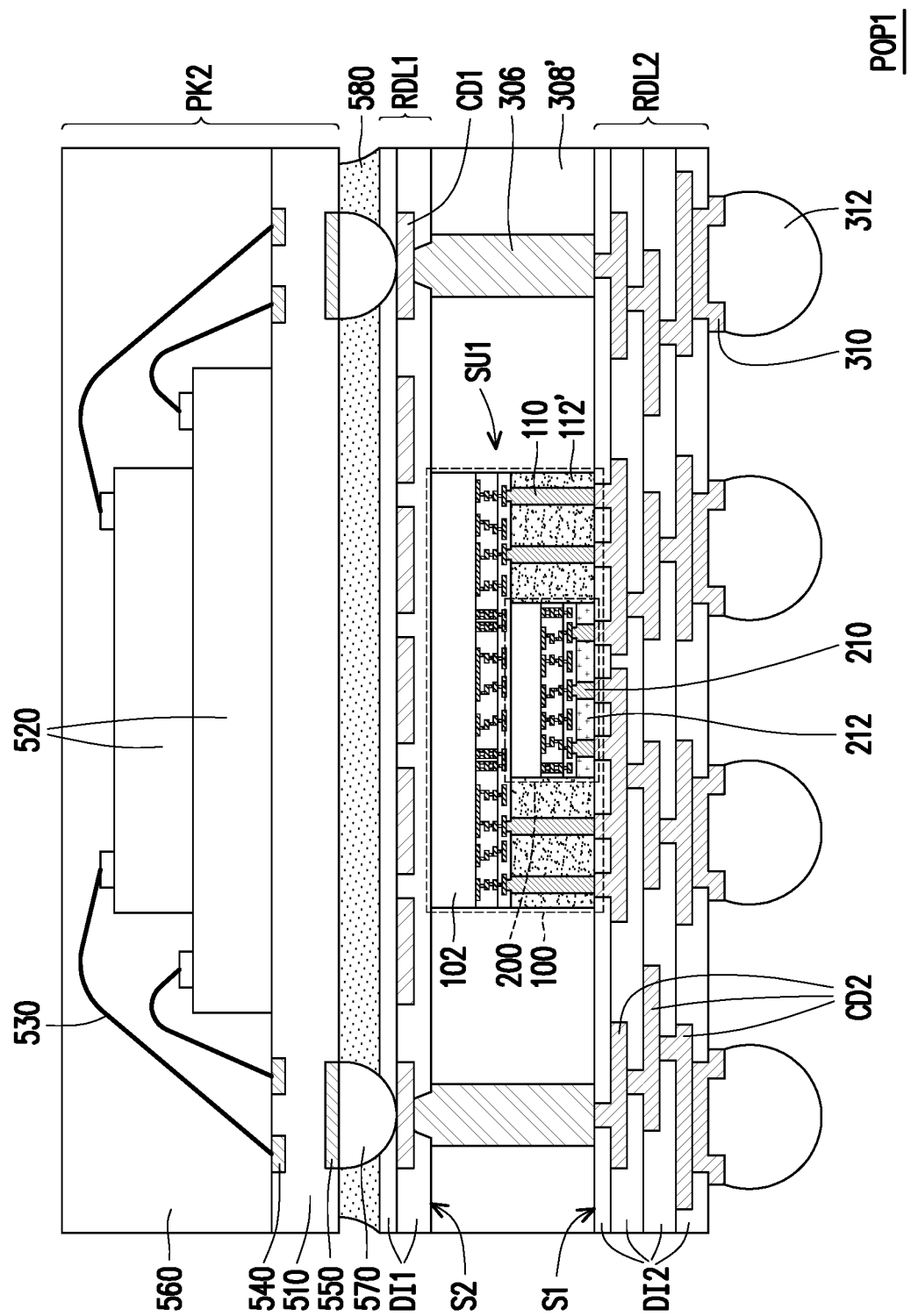
FIG. 11 is a schematic sectional view of a package-on-package (PoP) structure according to some exemplary embodiments of the present disclosure.

FIG. 11 is a schematic sectional view of a package-on-package (PoP) structure according to some exemplary embodiments of the present disclosure. Referring to FIG. 11, after fabricating a first package, such as the package structure PK1A illustrated in FIG. 2G, a second package PK2 may be stacked on the package structure PK1A (first package) so as to form a package-on-package (PoP) structure. As illustrated in FIG. 11, the second package PK2 is electrically connected to the conductive layer CD1 of the package structure PK1A (first package). In some embodiments, the second package PK2 has a substrate 510, a plurality of semiconductor chips 520 mounted on one surface (e.g. top surface) of the substrate 510 and stacked on top of one another. In some embodiments, bonding wires 530 are used to provide electrical connections between the semiconductor chips 520 and pads 540 (such as bonding pads). In some embodiments, an insulating encapsulant 560 is formed to encapsulate the semiconductor chips 520 and the bonding wires 530 to protect these components. In some embodiments, through insulator vias (not shown) may be used to provide electrical connection between the pads 540 and conductive pads 550 (such as bonding pads) that are located on another surface (e.g. bottom surface) of the substrate 510. In certain embodiments, the conductive pads 550 are electrically connected to the semiconductor chips 520 through these through insulator vias (not shown). In some embodiments, the conductive pads 550 of the package structure PK2 are electrically connected to conductive balls 570. Furthermore, the conductive balls 570 are electrically connected to the conductive layer CD1 of the redistribution layer RDL1 (backside redistribution layer) in the package structure PK1A (first package). In some embodiments, an underfill 580 is further provided to fill in the spaces between the conductive balls 570 to protect the conductive balls 570. After stacking the second package PK2 on the package structure PK1A (first package) and providing electrical connection therebetween, a package-on-package structure POP1 can be fabricated.

Figure 12:
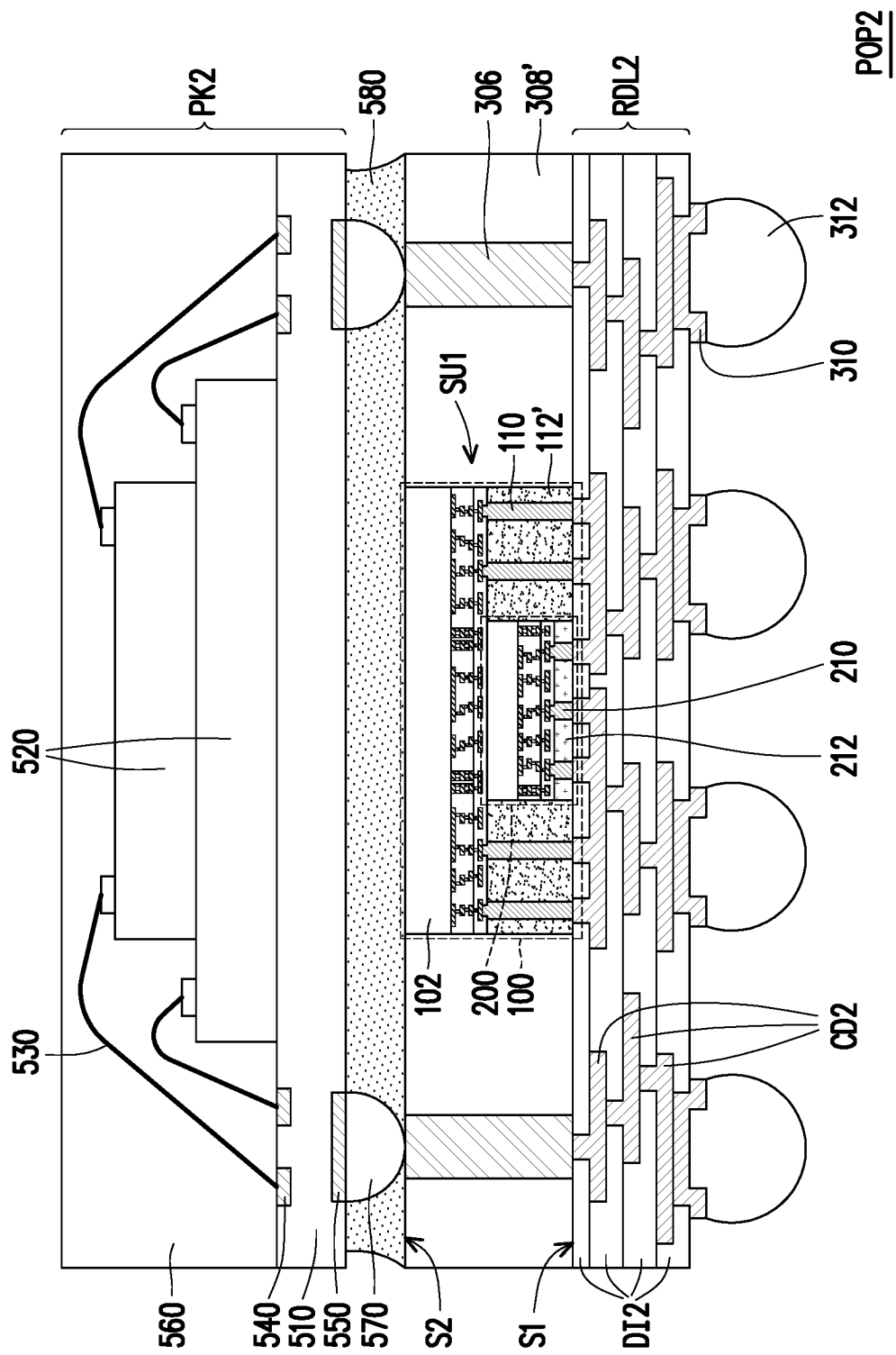
FIG. 12 is a schematic sectional view of a package-on-package (PoP) structure according to some other exemplary embodiments of the present disclosure.

FIG. 12 is a schematic sectional view of a package-on-package (PoP) structure according to some other exemplary embodiments of the present disclosure. The package-on-package structure POP2 illustrated in FIG. 12 is similar to the package-on-package structure POP1 illustrated in FIG. 11, hence the same reference numerals are used to refer to the same or liked parts, and its detailed description will be omitted herein. The difference between the embodiments is that the redistribution layer RDL1 is omitted from the package-on-package structure POP2. Referring to FIG. 12, in some embodiments, since the redistribution layer RDL1 is omitted, the conductive balls 570 of the second package PK2 may be directly connected to the through insulator vias 306 of the package structure PK1A (first package) to form the package-on-package structure POP2.

In the above-mentioned embodiments, at least one stacked die unit is included in the package structure or the package-on-package structure. The stacked die unit includes at least one second semiconductor die embedded within the protection layer of the first semiconductor die, wherein the second semiconductor die is surrounded by the first conductive posts. Furthermore, the redistribution layer is electrically connected to the first conductive posts of the first semiconductor die and the second conductive posts of the second semiconductor die respectively. Since the second semiconductor die is stacked on the first semiconductor die and embedded therein, the communication path (through the redistribution layer) between the semiconductor dies may be shortened. Overall, the performance and efficiency of the package structure may be improved.

In accordance with some embodiments of the present disclosure, a package structure including a first semiconductor die, at least one second semiconductor die, an insulating encapsulant and a redistribution layer is provided. The first semiconductor die has a plurality of first conductive posts and a first protection layer laterally surrounding the plurality of first conductive posts. The at least one second semiconductor die is embedded in the first protection layer and surrounded by the plurality of first conductive posts of the first semiconductor die, wherein the at least one second semiconductor die comprises a plurality of second conductive posts. The insulating encapsulant is encapsulating the first semiconductor die and the at least one second semiconductor die. The redistribution layer is disposed on the insulating encapsulant and connected with the plurality of first conductive posts and the plurality of second conductive posts, wherein the first semiconductor die is electrically connected with the at least one second semiconductor die through the plurality of first conductive posts, the redistribution layer and the plurality of second conductive posts.

In accordance with some other embodiments of the present disclosure, a package-on-package structure including a first package and a second package is provided. The second package includes a plurality of conductive balls electrically connected to the first package. The first package includes at least one stacked die unit, an insulating encapsulant and a redistribution layer. The at least one stacked die unit includes a first semiconductor die and at least one second semiconductor die. The first semiconductor die has a plurality of first conductive pads, a first passivation layer covering portions of the plurality of first conductive pads, a plurality of through vias disposed on the first passivation layer and electrically connected to the plurality of first conductive pads, and a protection layer disposed on the first passivation layer and covering the plurality of through vias. The at least one second semiconductor die is stacked on the first semiconductor die, wherein the at least one second semiconductor die comprises a plurality of second conductive pads, a second passivation layer covering portions of the plurality of second conductive pads and a plurality of conductive posts disposed on the second passivation layer and electrically connected to the plurality of second conductive pads, wherein the protection layer of the first semiconductor die covers the at least one second semiconductor die. The insulating encapsulant has a first surface and a second surface opposite to the first surface, wherein the insulating encapsulant encapsulates the at least one stacked die unit. The redistribution layer is disposed on the first surface of the insulating encapsulant and electrically connected to the plurality of through vias and the plurality of conductive posts.

In yet another embodiment of the present disclosure, a method of fabricating a package structure is described. The method includes the following steps. A stacked die unit is formed. The steps of forming the stacked die unit includes the following steps. A semiconductor wafer having a plurality of first semiconductor dies is provided, wherein each of the first semiconductor dies includes a first passivation layer and a plurality of first conductive posts formed on the first passivation layer. A second semiconductor die is fixed onto the first passivation layer of each of the first semiconductor dies in an area surrounded by the plurality of first conductive posts, wherein the second semiconductor die includes a plurality of second conductive posts. A first protection layer is formed on a surface of the first passivation layer of each of the first semiconductor dies to cover the plurality of first conductive posts and the second semiconductor die. The semiconductor wafer is diced to separate the plurality of first semiconductor dies to form the stacked die unit. The stacked die unit is bonded onto a carrier. An insulating encapsulant is formed to encapsulate the stacked die unit. A redistribution layer is formed on the insulating encapsulant and the stacked die unit, wherein the redistribution layer is electrically connected to the plurality of first conductive posts and the plurality of second conductive posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first semiconductor die, having a plurality of first conductive posts and a first protection layer laterally surrounding the plurality of first conductive posts;
at least one second semiconductor die, embedded in the first protection layer and surrounded by the plurality of first conductive posts of the first semiconductor die, wherein the at least one second semiconductor die comprises a plurality of second conductive posts and a second protection layer laterally surrounding the plurality of second conductive posts, and the second protection layer of the at least one second semiconductor die is located between the plurality of second conductive posts and the first protection layer of the first semiconductor die;

an insulating encapsulant encapsulating the first semiconductor die and the at least one second semiconductor die; and
a redistribution layer, disposed on the insulating encapsulant and connected with the plurality of first conductive posts and the plurality of second conductive posts, wherein the first semiconductor die is electrically connected with the at least one second semiconductor die through the plurality of first conductive posts, the redistribution layer and the plurality of second conductive posts.

2. The package structure according to claim 1, wherein the at least one second semiconductor die includes two or more second semiconductor dies embedded in the first protection layer of the first semiconductor die, and the plurality of first conductive posts surrounds the two or more second semiconductor dies.

3. The package structure according to claim 1, further comprising a die attach film located in between a backside of the second semiconductor die and a passivation layer of the first semiconductor die, and the at least one second semiconductor die is attached to the passivation layer of the first semiconductor die through the die attach film.

4. The package structure according to claim 1, wherein a backside of the at least one second semiconductor die is attached to a passivation layer of the first semiconductor die through fusion bonding.

5. The package structure according to claim 1, wherein tops of the plurality of first conductive posts are levelled with tops of the plurality of second conductive posts.

6. The package structure according to claim 1, further comprising a plurality of through insulator vias penetrating through the insulating encapsulant and a backside redistribution layer disposed on the insulating encapsulant and connected with the plurality of through insulator vias.

7. A package-on-package structure, comprising:
a first package and a second package stacked on the first package, wherein the second package comprises a plurality of conductive balls electrically connected to the first package,
wherein the first package comprises:
at least one stacked die unit, including:
a first semiconductor die, having a plurality of first conductive pads, a first passivation layer covering portions of the plurality of first conductive pads, a plurality of through vias disposed on the first passivation layer and electrically connected to the plurality of first conductive pads, and a protection layer disposed on the first passivation layer and covering the plurality of through vias; and
at least one second semiconductor die stacked on the first semiconductor die, wherein the at least one second semiconductor die comprises a plurality of second conductive pads, a second passivation layer covering portions of the plurality of second conductive pads and a plurality of conductive posts disposed on the second passivation layer and electrically connected to the plurality of second conductive pads, wherein the protection layer of the first semiconductor die covers the at least one second semiconductor die;
an insulating encapsulant having a first surface and a second surface opposite to the first surface, wherein the insulating encapsulant encapsulates the at least one stacked die unit; and a redistribution layer disposed on the first surface of the insulating encapsulant and electrically connected to the plurality of through vias and the plurality of conductive posts.

8. The package-on-package structure according to claim 7, wherein the first package further comprises:
a plurality of through insulator vias embedded within the insulating encapsulant; and
a backside redistribution layer disposed on the second surface of the insulating encapsulant, and the plurality of conductive balls of the second package is electrically connected to the backside redistribution layer of the first package through the plurality of through insulator vias.

9. The package-on-package structure according to claim 7, wherein two of the second semiconductor dies are disposed on the first passivation layer, and the plurality of through vias surrounds the second semiconductor dies.

10. The package-on-package structure according to claim 7, further comprising:
a third semiconductor die stacked on the at least one second semiconductor die, wherein the third semiconductor die comprises a plurality of third conductive pads, a third passivation layer covering portions of the plurality of third conductive pads, and the plurality of conductive posts of the at least one second semiconductor die surrounds the third semiconductor die.

11. The package-on-package structure according to claim 7, further comprising:
a third semiconductor die disposed on the first semiconductor die adjacent to the at least one second semiconductor die, wherein the third semiconductor die comprises a plurality of third conductive pads, a third passivation layer covering portions of the plurality of third conductive pads, and wherein the plurality of through vias of the first semiconductor die surrounds the third semiconductor die.

12. The package-on-package structure according to claim 7, further comprising a passive device disposed on the first passivation layer of the first semiconductor die and embedded within the protection layer.

13. The package-on-package structure according to claim 7, wherein a backside of at least one second semiconductor die is attached to the first passivation layer of the first semiconductor die through fusion bonding.

14. The package-on-package structure according to claim 7, wherein the first package comprises at least two stacked die units, and a number of stacked semiconductor dies in one of the stacked die unit is different than a number of stacked semiconductor dies in another one of the stacked die unit.

15. The package structure according to claim 1, wherein the first semiconductor die further comprises a first semiconductor substrate and a first interconnection layer disposed on the first semiconductor substrate, wherein the plurality of first conductive posts is electrically connected to the first interconnection layer.

16. The package structure according to claim 15, wherein the at least one second semiconductor die further comprises a second semiconductor substrate and a second interconnection layer disposed on the second semiconductor substrate, wherein the plurality of second conductive posts is electrically connected to the second interconnection layer, and the first protection layer is laterally surrounding the second semiconductor substrate and the second interconnection layer.

* * * * *